US012740051B2

(12) United States Patent
Sun et al.

(10) Patent No.: US 12,740,051 B2
(45) Date of Patent: Sep. 15, 2026

(54) MEMORY DEVICES HAVING VERTICAL TRANSISTORS AND FABRICATING METHODS THEREOF

(71) Applicant: YANGTZE MEMORY TECHNOLOGIES CO., LTD., Wuhan (CN)

(72) Inventors: Chao Sun, Wuhan (CN); Ning Jiang, Wuhan (CN); Wei Liu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 516 days.

(21) Appl. No.: 18/203,574

(22) Filed: May 30, 2023

(65) Prior Publication Data

US 2024/0381620 A1 Nov. 14, 2024

Related U.S. Application Data

(60) Provisional application No. 63/343,840, filed on May 19, 2022, provisional application No. 63/340,150, filed on May 10, 2022.

(30) Foreign Application Priority Data

May 8, 2023 (CN) ......................... 202310511701.0

(51) Int. Cl.
*H10B 12/00* (2023.01)

(52) U.S. Cl.
CPC ....... *H10B 12/395* (2023.02); *H10B 12/0383* (2023.02); *H10B 12/05* (2023.02); *H10B 12/053* (2023.02); *H10B 12/312* (2023.02); *H10B 12/33* (2023.02); *H10B 12/34* (2023.02); *H10B 12/482* (2023.02); *H10B 12/488* (2023.02)

(58) Field of Classification Search
CPC .. H10B 12/395; H10B 12/0383; H10B 12/05; H10B 12/312; H10B 12/33; H10B 12/482
See application file for complete search history.

(56) References Cited

U.S. PATENT DOCUMENTS

| | | | | |
|---|---|---|---|---|
| 11,164,879 | B2 * | 11/2021 | Pille | G11C 11/412 |
| 2007/0087499 | A1 * | 4/2007 | Seo | H10D 89/10 257/E21.655 |
| 2013/0001675 | A1 * | 1/2013 | Chung | H10B 12/053 257/329 |
| 2023/0301070 | A1 * | 9/2023 | Xiao | H10D 30/63 |

* cited by examiner

*Primary Examiner* — Eliseo Ramos Feliciano
*Assistant Examiner* — Brad A Knudson
(74) *Attorney, Agent, or Firm* — BAYES PLLC

(57) ABSTRACT

Three-dimensional (3D) semiconductor devices and fabricating methods are disclosed. The semiconductor device includes an array of vertical transistors. Each vertical transistor includes a semiconductor body extending in a vertical direction, and an all-around gate structure laterally surrounding the semiconductor body. Each row of the vertical transistors in a first lateral direction share a common word line extending in the first lateral direction and comprising the all-around gate structures of the row of the vertical transistors. Adjacent rows of the vertical transistors are misaligned along a second lateral direction perpendicular with the first lateral direction. The array of vertical transistors are aligned along a third lateral direction different from the first lateral direction and the second lateral direction.

20 Claims, 30 Drawing Sheets

200C

200D

300A

500

MEMORY DEVICES HAVING VERTICAL TRANSISTORS AND FABRICATING METHODS THEREOF

CROSS-REFERENCE TO RELATED APPLICATIONS

This application claims the benefit of priorities to U.S. Provisional Application No. 63/340,150, filed on May 10, 2022, U.S. Provisional Application No. 63/343,840, filed on May 19, 2022, and Chinese Application No. 202310511701.0, filed on May 8, 2023, all of which are hereby incorporated by reference in their entireties.

TECHNICAL FIELD

The present disclosure generally relates to the field of semiconductor technology, and more particularly, to memory devices and fabrication methods thereof.

BACKGROUND

Planar memory cells are scaled to smaller sizes by improving process technology, circuit design, programming algorithm, and fabrication process. However, as feature sizes of the memory cells approach a lower limit, planar process, and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one implementation, a semiconductor device, comprising: an array of vertical transistors each comprising: a semiconductor body extending in a vertical direction, and an all-around gate structure laterally surrounding the semiconductor body; wherein each row of the vertical transistors in a first lateral direction share a common word line extending in the first lateral direction and comprising the all-around gate structures of the row of the vertical transistors, and adjacent rows of the vertical transistors are misaligned along a second lateral direction perpendicular with the first lateral direction.

In one implementation, the array of vertical transistors are aligned along a third lateral direction different from the first lateral direction and the second lateral direction.

In one implementation, a lateral cross section of the semiconductor body has a longitudinal axis along the third lateral direction.

In one implementation, the lateral cross section of the semiconductor body has an oval-like shape.

In one implementation, the lateral cross section of the semiconductor body has rounded corners.

In one implementation, the semiconductor device further comprises: a plurality of spacers each extending along the first lateral direction between rows of the vertical transistors to separate adjacent word lines.

In one implementation, the plurality of spacers comprise: a plurality of first spacers and second spacers alternatively arranged along the second lateral direction, a first depth of the first spacers is greater than a second depth of the second spacers.

In one implementation, two adjacent vertical transistors along the third lateral direction and separated by one second spacer share a common source/drain at a joint first end of the semiconductor bodies of the two adjacent vertical transistors and connected to a bit line extending along the second lateral direction; and two adjacent vertical transistors along the third lateral direction and separated by one first spacer are connected to adjacent two bit lines, respectively.

In one implementation, each vertical transistor further comprises: a gate dielectric layer between the all-around gate structure and the semiconductor body.

In one implementation, the semiconductor device further comprises: an array of memory cells, each memory cell comprising: one of the array of vertical transistors; and a capacitor in electrical connection with a separated source/drain at a second end of the one of the array of vertical transistors, wherein the first end is opposite to the joint first end.

In one implementation, a method of forming a semiconductor device comprises: forming an array of semiconductor bodies comprising rows of semiconductor bodies aligned along a first lateral direction, wherein adjacent rows of semiconductor bodies are misaligned along a second lateral direction perpendicular to the first lateral direction, and the array of semiconductor bodies are also aligned along a third lateral direction different from the first lateral direction and the second lateral direction; forming a conductive structure laterally surrounding each of the array of semiconductor bodies; and forming a plurality of spacers each extending along the first lateral direction to separate adjacent rows of the semiconductor bodies.

In one implementation, forming the array of semiconductor bodies comprises: forming a plurality of third trenches in a semiconductor layer each extending along the third lateral direction; and forming a plurality of first trenches and second trenches in the semiconductor layer each extending along the first lateral direction, wherein the plurality of first trenches and second trenches are alternatively arranged along the second lateral direction, a first depth of the first trenches is greater than a second depth of the second trenches.

In one implementation, forming the array of semiconductor bodies further comprises: removing portions each of the array of semiconductor bodies to make each semiconductor body having a curved sidewall.

In one implementation, forming the array of semiconductor bodies further comprises: removing portions each of the array of semiconductor pillars to make a lateral cross section of each semiconductor body having an oval-like shape with a longitudinal axis along the third lateral direction.

In one implementation, forming the plurality of conductive structures comprises: forming a gate dielectric layer on a sidewall of each of the array of semiconductor bodies; forming a lower trench isolation structure on a bottom of the plurality of first trenches, second trenches, and third trenches; and forming the conductive structure to laterally surround the gate dielectric layer on the sidewall of each of the array of semiconductor bodies.

In one implementation, forming the plurality of spacers comprises: forming a plurality of first spacers in the first trenches; and forming a plurality of second spacers in the second trenches; wherein the conductive structure is separated by the plurality of first and second spacers into a plurality of all-round gate structure each extending along the first lateral direction and surrounding each of a corresponding row of the semiconductor bodies.

In one implementation, the method further comprises: removing an upper portions of the conductive structure; forming a filling dielectric structure above the conductive structure; forming a first doped region at a first end of each semiconductor body; forming a capacitor in electrical connection with the first doped region.

In one implementation, the method further comprises: thinning the semiconductor layer, such that two adjacent semiconductor bodies next to one first spacer is separated while a pair of semiconductor bodies next to one second spacer is connected at a connected second end of the pair of semiconductor bodies; forming a common second doped region at the connected second end of the pair of semiconductor bodies; and forming a bit line in electrical connection with the common second doped region.

In one implementation, a memory system comprises: a memory device comprising an array of memory cells, each memory cell comprising: a capacitor, and a vertical transistor comprising: a semiconductor body extending in a vertical direction, and an all-around gate structure laterally surrounding the semiconductor body; wherein each row of the vertical transistors in a first lateral direction share a common word line extending in the first lateral direction and comprising the plurality of all-around gate structures of the row of the vertical transistors, and adjacent rows of vertical transistors are misaligned along a second lateral direction perpendicular with the first lateral direction; and a memory controller configured to control the memory device.

In one implementation, a lateral cross section of the semiconductor body has an oval shape with a longitudinal axis along a third lateral direction different from the first lateral direction and the second lateral direction; and the array of vertical transistors are aligned along the third lateral direction.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1:
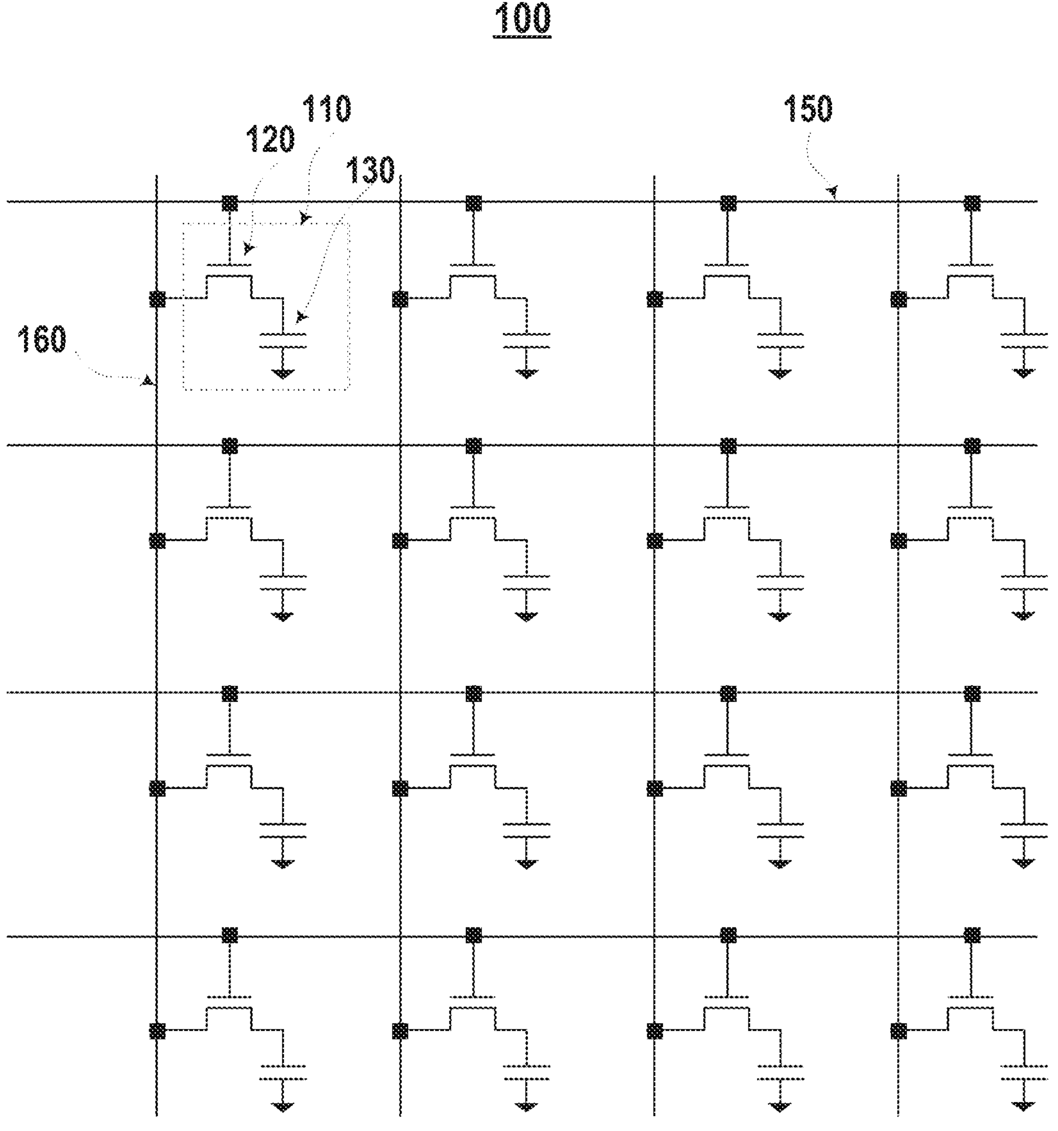
FIG. 1 illustrates a schematic circuit diagram of an exemplary memory device including an array of memory cells each having a vertical transistor, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

To address one or more of the aforementioned issues, the present disclosure introduces a solution in which vertical transistors replace the conventional planar transistors as the switch and selecting devices in a memory cell array of memory devices (e.g., DRAM, PCM, and FRAM). In the following descriptions, DRAM is used as a non-exclusive example of the present disclosure. Compared with planar transistors, the vertically arranged transistors (i.e., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and one below the transistors), such that the process margin of the bit lines can be increased and the coupling capacitance between the bit lines and the storage units can be decreased.

Consistent with the scope of the present disclosure, according to some implementations of the present disclosure, the memory cell array having vertical transistors each comprising a semiconductor body extending in a vertical direction, and a gate structure beside the semiconductor structure. In some implementations, the word lines and bit lines connected to the vertical transistors are arranged along a first lateral direction and a second direction, respectively. The semiconductor bodies of the array of vertical transistors are aligned along a third lateral direction different from the first and second lateral directions. By using such an arrangement, memory area efficiency can be increased. Further, the memory cell array and the peripheral circuits can be formed separately on different wafers, such that the fabricating processes of the memory cell array and the peripheral circuits do not affect each other, and the memory area efficiency can be further increased.

FIG. 1 illustrates a schematic diagram of an exemplary memory device 100 having an array of memory cells each having a vertical transistor, according to some implementations of the present disclosure. Memory device 100 can include a memory cell array in which each memory cell 110 includes a vertical transistor 120 and a storage unit coupled to vertical transistor 120. In some implementations as shown in FIG. 1, the memory cell array is a DRAM cell array, and the storage unit is a capacitor 130 for storing charge as the binary information stored by the respective DRAM cell. In some other implementations not shown in the figures, the memory cell array is a PCM cell array, and the storage unit can be a PCM element (e.g., including chalcogenide alloys) for storing binary information of the respective PCM cell based on the different resistivities of the PCM element in the amorphous phase and the crystalline phase. In some implementations not shown in the figures, the memory cell array is a FRAM cell array, and the storage unit can be a ferroelectric capacitor for storing binary information of the respective FRAM cell based on the switch between two polarization states of ferroelectric materials under an external electric field.

As shown in FIG. 1, memory cells 110 can be arranged in a two-dimensional (2D) array having rows and columns. Memory device 100 can include word lines 150 coupling the memory cell array to peripheral circuits for controlling the switch of vertical transistors 120 in memory cells 110 located in a row, as well as bit lines 160 coupling the memory cell array to peripheral circuits for sending data to and/or receiving data from memory cells 110 located in a column. That is, each word line 150 is coupled to a respective row of memory cells 110, and each bit line 160 is coupled to one or more respective logic columns of memory cells 110. In some implementations, the gate of vertical transistor 120 is coupled to word line 150, one of the source and the drain of vertical transistor 120 is coupled to bit line 160, the other one of the source and the drain of vertical transistor 120 is coupled to one electrode of capacitor 130, and the other electrode of capacitor 130 is coupled to the ground.

Consistent with the scope of the present disclosure, vertical transistors 120, such as vertical metal-oxide-semiconductor field-effect transistors (MOSFETs), can replace the conventional planar transistors as the pass transistors of memory cells 110 to reduce the area occupied by the pass transistors, the coupling capacitance, as well as the interconnect routing complexity, as described below in detail.

Figure 2A:
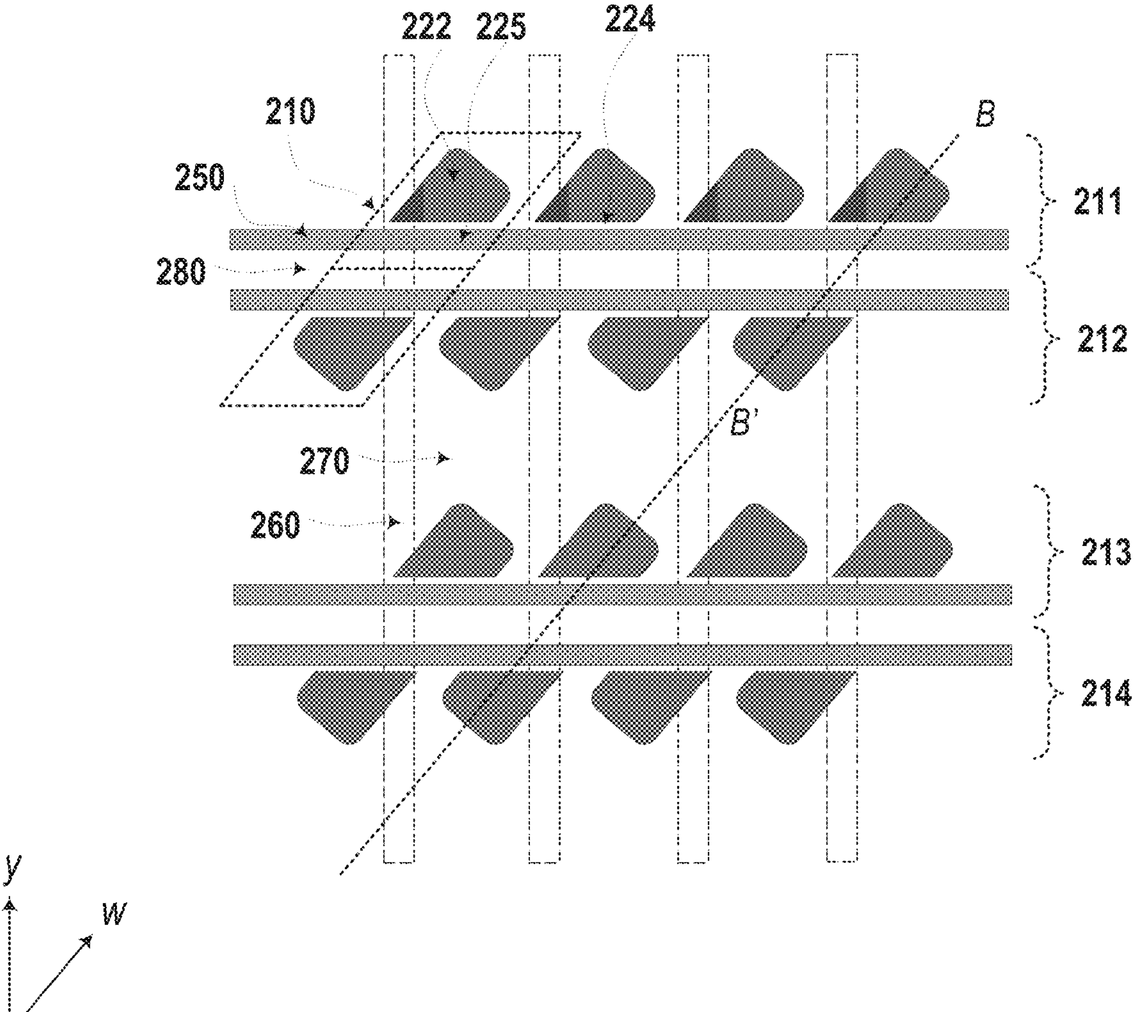
FIGS. 2A-2C each illustrates a schematic plan view of an array of memory cells each including a vertical transistor in an exemplary memory device, according to various implementations of the present disclosure.
Figure 2B:
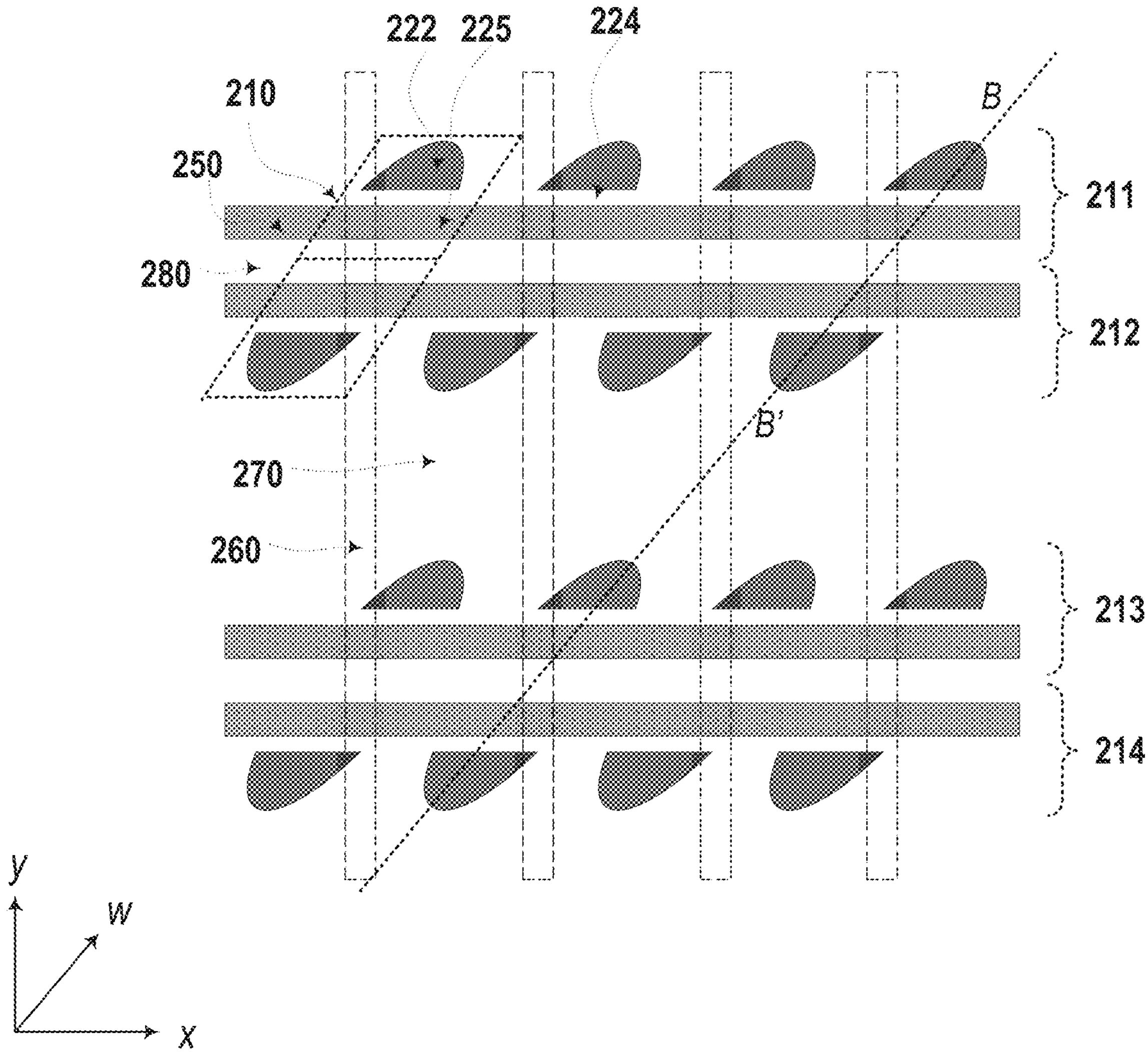
Figure 2C:
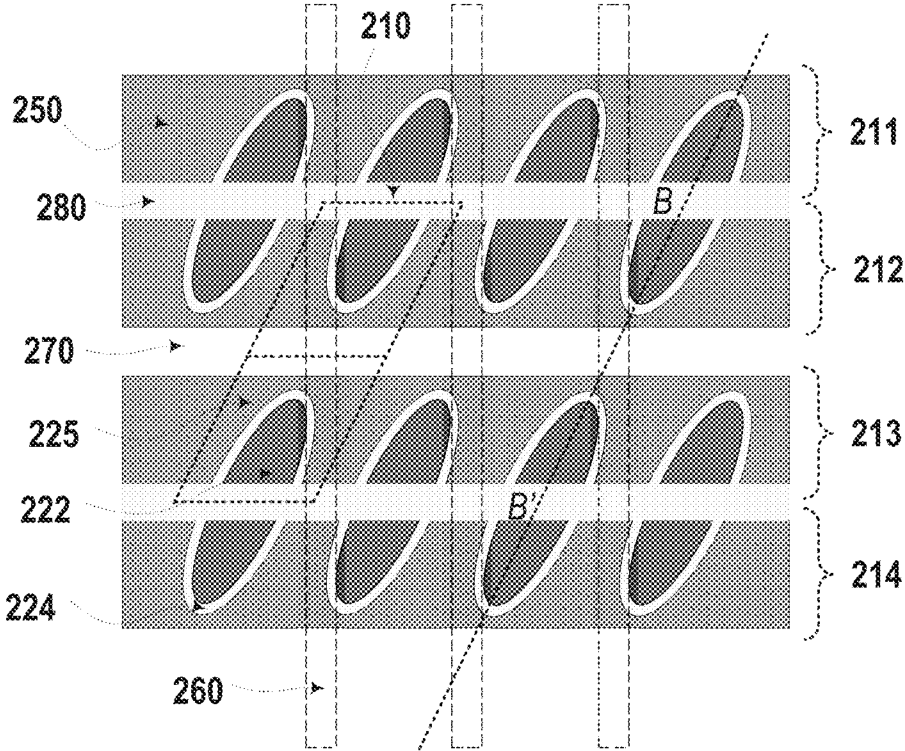
Figure 2C:
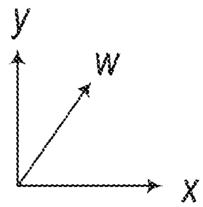

FIGS. 2A-2C each illustrates a schematic plan view of an array of memory cells each including a vertical transistor in an exemplary memory device, according to various implementations of the present disclosure. As shown in FIGS. 2A-2C, memory device 200A/200B/200C can include a plurality of word lines 250 each extending in a first lateral direction (the x-direction, referred to as the word line direction). Memory device 200A/200B/200C can also include a plurality of bit lines 260 each extending in a second lateral direction perpendicular to the first lateral direction (the y-direction, referred to as the bit line direction). It is understood that FIGS. 2A-2C do not illustrate cross-section views of memory device 200A/200B/200C in the same lateral plane, and word lines 250 and bit lines 260 may be formed in different lateral planes for ease of routing as described below in detail.

Figure 2D:
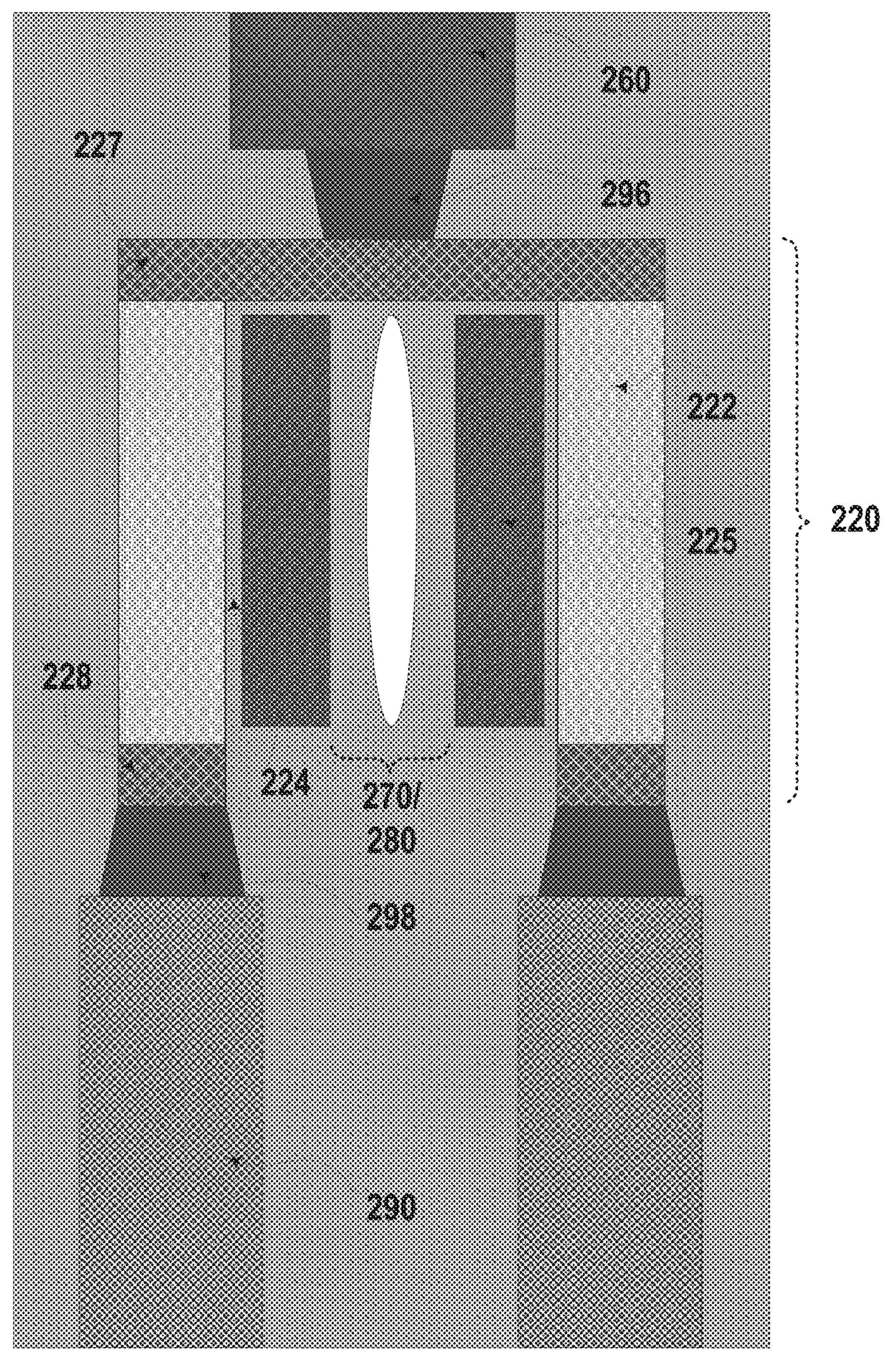
FIG. 2D illustrates a schematic side view of a cross-section of a pair of memory cells in exemplary 3D memory devices shown in FIGS. 2A-2C, according to some implementations of the present disclosure.

In some implementations, each memory cell 210 includes a storage unit and a vertical transistor 220 having a semiconductor body 222 and a gate structure 225. Each row of vertical transistors 220 are aligned along a first lateral direction (i.e., x-direction), and the gate structures 225 of each row of vertical transistors 220 are connected with each other to form a word line 250 extending along the first lateral direction. In some implementations, the bit lines 260 extend in parallel along a second lateral direction (i.e., y-direction) and are connected with the vertical transistors 220. In some implementations, the array of vertical transistors 220 are also aligned along a third lateral direction (i.e., w-direction) different from the first and second lateral direction. Two adjacent vertical transistors 220 along the third lateral direction can share a common source/drain, which is connected to a corresponding bit line 260, and can be referred to as a pair of vertical transistors 220. The two adjacent memory cells 210 including the pair of vertical transistors 220 sharing a same bit line 260 can be referred to a pair of memory cells 210. FIG. 2D illustrates a schematic side view of a cross-section of a pair of memory cells 210 in each of the 3D memory devices, as shown in FIGS. 2A-2C, according to some implementations of the present disclosure. It is noted that FIG. 2D illustrates a cross-sectional side view of BB' line of a pair of memory cells 210 in FIGS. 2A-2C along the third lateral direction, and some components shown in FIG. 2D are omitted in FIGS. 2A-2C.

Referring to FIGS. 2A-2D, semiconductor body 222 can extend in the vertical direction (i.e., z-direction) perpendicular to the first, second, and third lateral directions. Different from planar transistors in which the active regions are formed in the substrates, vertical transistor 220 includes a semiconductor body 222 extending vertically (in the z-direction). It is understood that semiconductor body 222 may have any suitable 3D shape, such as polyhedron shapes or a cylinder shape. That is, the cross-section of semiconductor body 222 in the plan view (e.g., in the x-y plane) can have a square shape, a rectangular shape (or a trapezoidal shape), a circular shape, a partial circular shape, an oval shape, a partial oval shape, or any other suitable shapes.

In a first example as shown in FIG. 2A, the cross-section of two semiconductor bodies 222 of a pair of vertical transistors 220 (included by dotted lines) can be portions of a rectangle-like shape with a longitudinal axis along the third lateral direction (w-direction) and with rounded corners. In some implementations, semiconductor bodies 222 between adjacent pairs of vertical transistors 220 along the second lateral direction (y-direction) can be laterally separated by a first spacer 270, and the two semiconductor bodies 222 within a pair of vertical transistors 220 can be laterally separated by a second spacer 280. The plurality of first spacers 270 and second spacers 280 extend in parallel along the first lateral direction, and are alternatively arranged along the second lateral direction.

In some implementations, each vertical transistor 220 can also include a gate structure 225 located at one side of the semiconductor body 222. The gate structure 225 of adjacent vertical transistors 220 in the first lateral direction (i.e., the word line direction or the x-direction) are continuous, e.g., parts of a continuous conductive layer having the gate structures 225. That is, multiple gate structures 225 of a row (e.g., 211-214) of vertical transistors 220 can be connected with each other and extending along the first lateral direction to form a word line 250 of the row of vertical transistors 220.

The two word lines 250 of two adjacent rows of vertical transistors 220 that form pairs of vertical transistors can be embedded in a same second spacer 280 separating the two adjacent rows of vertical transistors 220, as shown in FIG. 2A. Gate structures 225 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate structures 225 may include doped polysilicon, i.e., a gate poly. In some implementations, gate structures 225 includes multiple conductive layers, such as a W layer over a TiN layer. In some implementations, a gate dielectric 224 is laterally between the gate structure 225 and the semiconductor body 222. Gate dielectric 224 can include any suitable dielectric materials, such as silicon oxide, silicon nitride, silicon oxynitride, or high-k dielectrics. For example, gate dielectric 224 may include silicon oxide, i.e., gate oxide.

In some implementations, the plurality of first spacers 270 and second spacers 280 can include any suitable dielectric material, such as silicon oxide. In some implementations, each of the plurality of first spacers 270 and second spacers 280 can further include one or more air gaps (not shown) embedded in the dielectric material. As described below with respect to the fabrication process, the air gaps may be formed due to the relatively small pitches of word lines 250 (and rows of memory cells 210) along the second lateral direction. On the other hand, the relatively large dielectric constant of air in air gaps (e.g., about 4 times the dielectric constant of silicon oxide) can improve the insulation effect between word lines 250 (and rows of memory cells 210) compared with some dielectrics (e.g., silicon oxide).

In a second example as shown in FIG. 2B, the cross-section of two semiconductor bodies 222 of a pair of vertical transistors 220 (included by dotted lines) can be portions of an oval-like shape with a longitudinal axis along the third lateral direction (w-direction). In some implementations, semiconductor bodies 222 between adjacent pairs of vertical transistors 220 along the second lateral direction (y-direction) can be laterally separated by a first spacer 270, and the two semiconductor bodies 222 within a pair of vertical transistors 220 can be laterally separated by a second spacer 280. The plurality of first spacers 270 and second spacers 280 extend in parallel along the first lateral direction, and are alternatively arranged along the second lateral direction. That is, each semiconductor body 222 can include a flat sidewall facing the second spacer 280 and a curved sidewall facing the first spacer 270.

In some implementations, the gate structure 225 of each vertical transistor 220 is located beside the flat sidewall of the semiconductor body 222. The gate structures 225 of each row of vertical transistors 220 along the first lateral direction (x-direction) are connected with each other and form a word line 250 extending along the first lateral direction. The two word lines 250 of two adjacent rows of vertical transistors 220 that form pairs of vertical transistors can be embedded in a same second spacer 280 separating the two adjacent rows of vertical transistors 220, as shown in FIG. 2B. In some implementations, a gate dielectric 224 is laterally between the gate structure 225 and the flat sidewall of the semiconductor body 222.

In a third example as shown in FIG. 2C, the cross-section of two semiconductor bodies 222 of two adjacent vertical transistors 220 separated by a second spacer 280 can be portions of an oval-like shape with a longitudinal axis along the third lateral direction (w-direction). In some implementations, adjacent vertical transistors 220 in the second lateral direction separated by a first spacer 270 can form a pair of vertical transistors (included in the dotted lines) sharing a common source/drain. The plurality of first spacers 270 and second spacers 280 extend in parallel along the first lateral direction, and are alternatively arranged along the second lateral direction.

As shown in FIG. 2C, the plurality of first spacers 270 and second spacers 280 are alternatively arranged along the second lateral direction. Each first spacer 270 is located between the curved sidewalls of the semiconductor bodies 222 of two adjacent rows of vertical transistors 220. Each second spacer 280 is located between the flat sidewalls of the semiconductor bodies 222 of two adjacent rows of vertical transistors 220. That is, each semiconductor body 222 can include a flat sidewall facing the second spacer 280 and a curved sidewall facing the first spacer 270.

In some implementations, the gate structure 225 of each vertical transistor 220 can surround multiple sides of semiconductor body 222, i.e., surrounding the active region in which channels are formed from multiple lateral directions. In other words, the active region of vertical transistor 220, i.e., semiconductor body 222, can be at least partially surrounded by gate structure 225. For example, as shown in FIG. 2C, the vertical transistor can be a three-sided gate transistor in which gate structure 225 surrounds semiconductor body 222 from three lateral directions. The three-sided gate structure 225 can surround the curved sidewall of the semiconductor body 222. Thus, a larger active channel region can be formed between the source and drain in operation to generate a larger gate control area for achieving better channel control with a smaller subthreshold swing. During the off state, since the channel is fully depleted, the leakage current ($I_{off}$) of vertical transistor 220 can be significantly reduced.

As shown in FIG. 2C, the three-sided gate structure 225 of adjacent vertical transistors 220 in the first lateral direction (i.e., the word line direction or the x-direction) are continuous, e.g., parts of a continuous conductive layer having three-sided gate structure 225. That is, multiple three-sided gate structures 225 of a row (e.g., 211-216) of vertical transistors 220 can be connected with each other and extending along the first lateral direction to form a word line 250 of the row of vertical transistors 220. In some implementations, a gate dielectric 224 is laterally between the three-sided gate structure 225 and the curved sidewall of the semiconductor body 222. The gate dielectrics 224 of adjacent vertical transistors 220 in the word line direction are separate, e.g., not parts of a continuous dielectric layer having gate dielectrics 224.

As shown in FIGS. 2A-2C, in some implementations, the semiconductor bodies 222 are aligned along the third lateral direction (w-direction) with non-zero angles with respect to the first lateral direction and the second lateral direction. As described in detail with the fabricating processed below, the semiconductor bodies 222 of a pair of vertical transistors 220 can be portions of a semiconductor pillar separated by a second spacer 280. The semiconductor pillar can have a rectangular-like shape or an oval shape with a longitudinal axis along the third lateral direction.

In some implementations, a first angle between the first lateral direction (x-direction) and the third lateral direction (w-direction), as well as a second angle between the second lateral direction (y-direction) and the third lateral direction (w-direction), can be determined by a first distance between adjacent bit lines 260 and a second distance between adjacent word lines 250. Specifically, a cotangent function of the first angle, or a tangent function of the second angle, can be approximately proportional to a first distance between adjacent bit lines, and reversely proportional to a double value of a second distance between adjacent word lines.

By aligning the semiconductor bodies 222 along the third lateral direction different from the first and second lateral direction, the first distance between adjacent bit lines 260 and the second distance between adjacent word lines 250 can be reduced to increase memory area inefficiencies. For example, when the first distance decreases by about 30%, the second angle can be about 25°, and the memory area can be reduced by about 25% to contain a same number of memory cells 210. As another example, when the first distance decreases by about 50%, the second angle can be about 22°, and the memory area can be reduced by about 30% to contain a same number of memory cells 210.

Referring to FIG. 2D, a schematic side view of a cross-section of a pair of memory cells 210 is shown according to some implementations of the present disclosure. It is noted that, the cross-section 200D can be a pair of memory cells 210 in any one of the 3D memory devices 200A, 200B, and 200C as shown in FIGS. 2A-2C. It is also noted that, the cross-section 200D is a vertical plane along the third lateral direction (the BB' line in FIGS. 2A-2C) and the vertical direction (z-direction). In the third lateral direction, the gate structures 225 of a pair of vertical transistors 220 are located between the two semiconductor bodies 222, and are separated by first spacer 270 or second spacer 280 with one or more air gaps embedded therein.

As shown in FIG. 2D, each vertical transistor 220 can include a pair of a source and a drain 227, 228 (S/D, dope regions, a.k.a., source electrode and drain electrode) formed at the two ends of semiconductor body 222 in the vertical direction (the z-direction), respectively. The source and drain 227, 228 can be doped with any suitable P-type dopants, such as boron (B) or Gallium (Ga), or any suitable N-type dopants, such as phosphorus (P) or arsenic (As). In each vertical transistor 220, the source and drain 227, 228 can be separated at two ends of the semiconductor body 222 in the vertical direction (the z-direction). Gate structure 225 is formed vertically corresponding to the portion of the semiconductor body 222 between the source and drain 227, 228. As a result, the channel of the vertical transistor 220 can be formed in semiconductor body 222 vertically between the source and drain 227, 228 when a gate voltage applied to the gate structure 225 is above the threshold voltage of the vertical transistor 220.

As shown in FIG. 2D, a pair of vertical transistors 220 can have separated sources/drains 228 connected to a storage unit (e.g., a capacitor 290) through a storage unit contact 298, and can also have a common source/drain 227 connected to a bit line 260 through a bit line contact 296. It is noted that the storage unit can include any devices that are capable of storing binary data (e.g., 0 and 1), including but not limited to, capacitors for DRAM cells and FRAM cells, and PCM elements for PCM cells. In some implementations, each vertical transistor 220 controls the selection and/or the state switch of the respective storage unit coupled to vertical transistor 220.

In some implementations as shown in FIG. 2D, the storage unit is a capacitor 290 including a first electrode (not shown) coupled with the source/drain 228 of vertical transistor 220. Capacitor 290 can also include a capacitor dielectric (not shown) in contact with the first electrode, and a second electrode (not shown) in contact with the capacitor dielectric. That is, capacitor 290 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, the two electrodes can include conductive materials including, but not limited to, W, Co, Cu, Al, TiN, TaN, polysilicon, silicides, or any combination thereof.

It is understood that the capacitor 290 may include any suitable structure and configuration, such as a planar capacitor, a stack capacitor, a multi-fins capacitor, a cylinder capacitor, a trench capacitor, or a substrate-plate capacitor. That is, capacitor 290 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground.

In some implementations, one or more peripheral circuits (not shown) can be coupled to the memory cell array shown in 200A/200B/200C through bit lines 260, word lines 250, and any other suitable metal wirings. It is noted that the one or more peripheral circuits can include any suitable circuits for facilitating the operations of memory cell array 200A/200B/200C by applying and sensing voltage signals and/or current signals through word lines 250 and bit lines 260 to and from each memory cell 210. The one or more peripheral circuits can include various types of peripheral circuits formed using CMOS technologies.

Figure 3A:
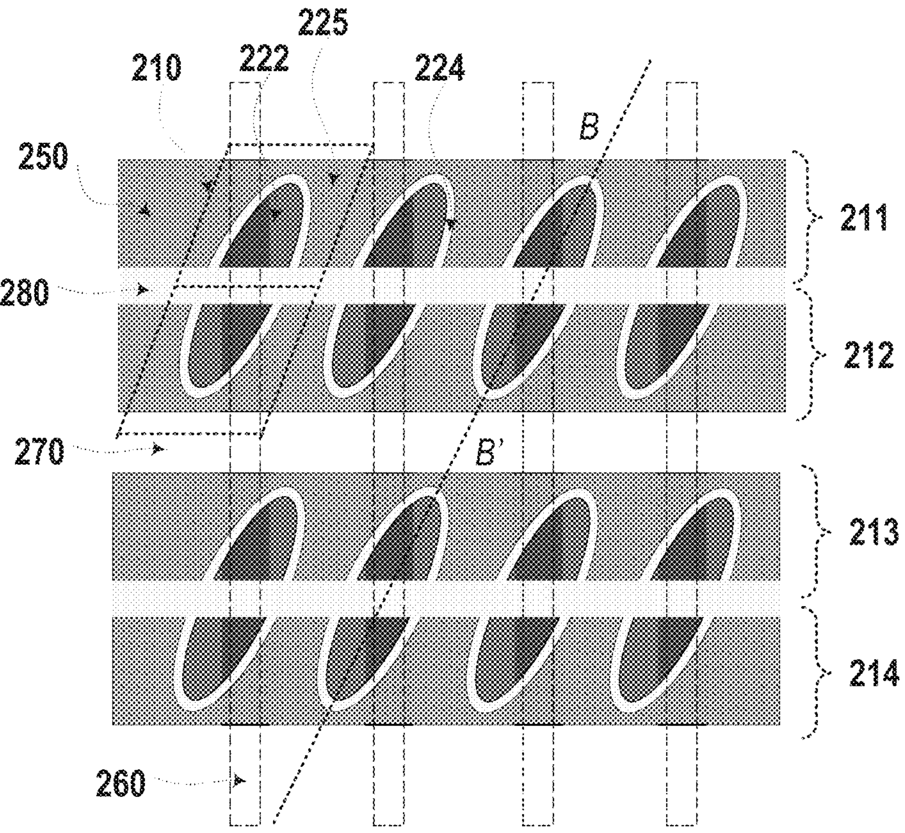
FIGS. 3A-3B each illustrates a schematic plan view of an array of memory cells each including a vertical transistor in an exemplary memory device, according to various implementations of the present disclosure.
Figure 3A:
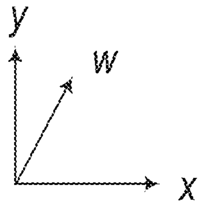
Figure 3B:
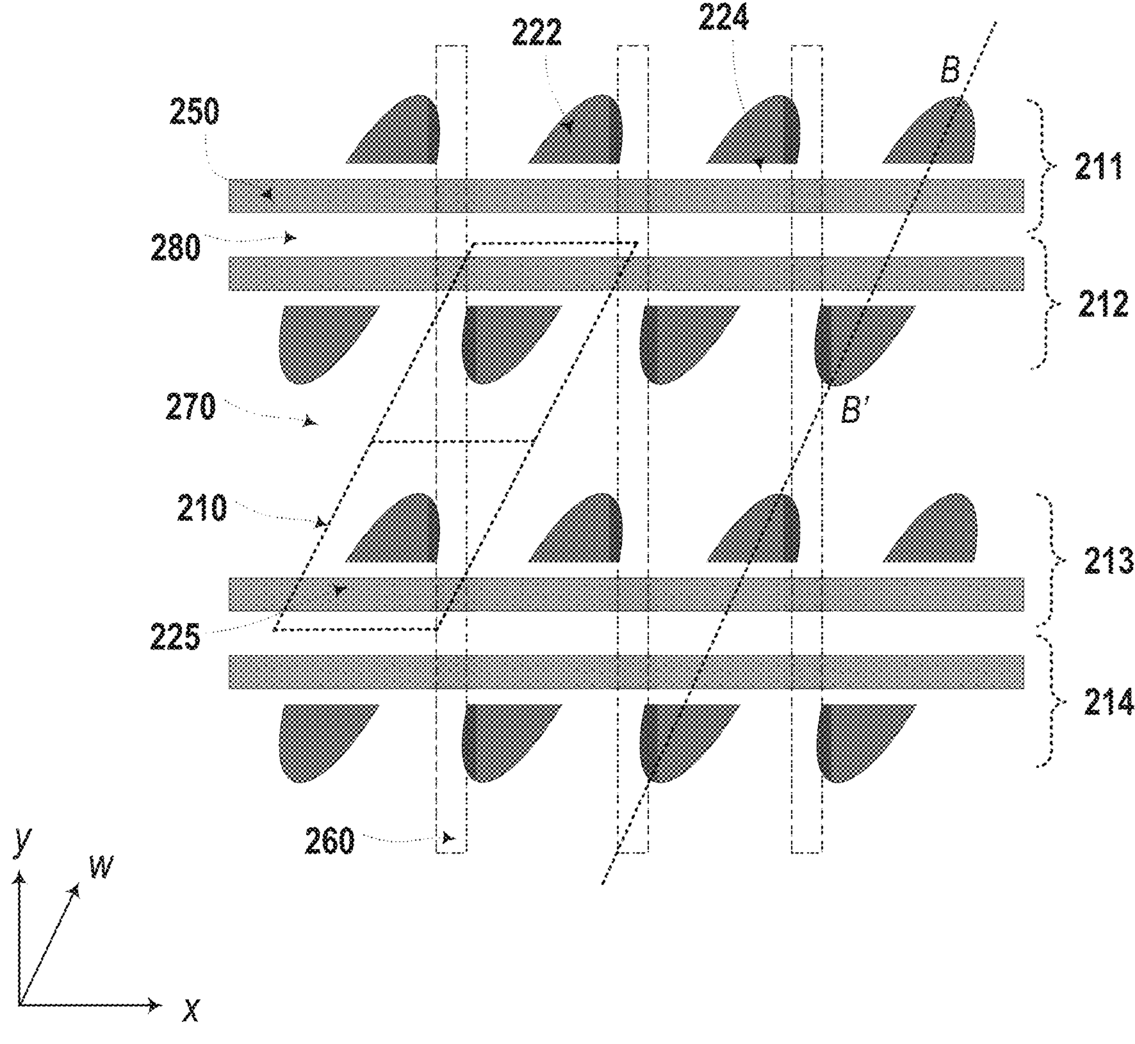
Figure 3C:
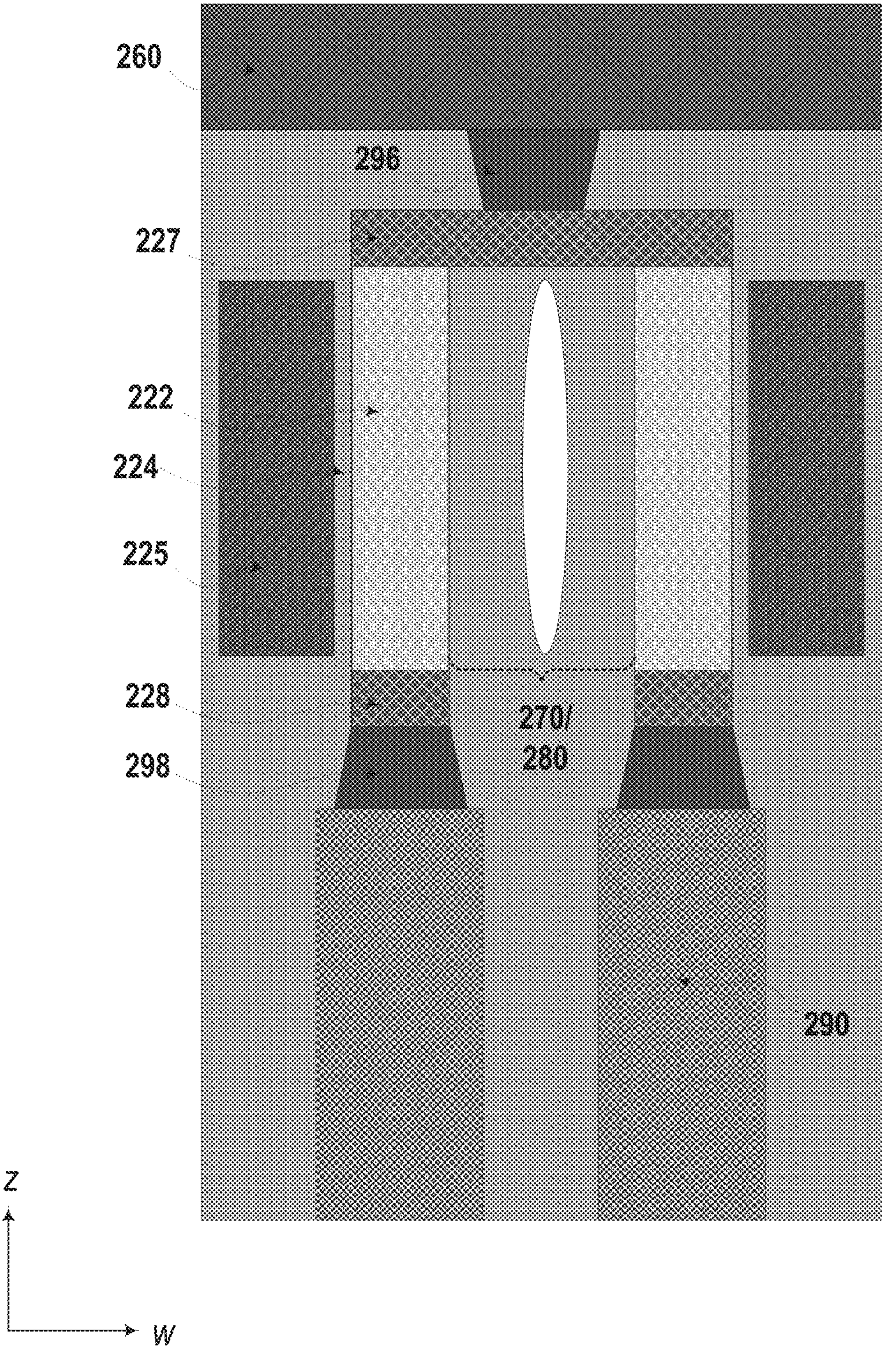
FIG. 3C illustrates a schematic side view of a cross-section of a pair of memory cells in exemplary 3D memory devices shown in FIGS. 3A-3B, according to some implementations of the present disclosure.

FIGS. 3A-3B each illustrates a schematic plan view of an array of memory cells each including a vertical transistor in an exemplary memory device, according to various implementations of the present disclosure. FIG. 3C illustrates a schematic side view of a cross-section of a pair of memory cells 210 along the BB' line of FIG. 3A or 3B, according to some implementations of the present disclosure.

In a fourth example as shown in FIG. 3A, the cross-section of two semiconductor bodies 222 of a pair of vertical transistors 220 (included in the dotted lines) separated by a second spacer 280 can be portions of an oval-like shape with a longitudinal axis along the third lateral direction (w-direction). In some implementations, adjacent pairs of vertical transistors 220 can be separated by a first spacer 270 in the second lateral direction. The plurality of first spacers 270 and second spacers 280 extend in parallel along the first lateral direction, and are alternatively arranged along the second lateral direction.

As shown in FIG. 3A, the plurality of first spacers 270 and second spacers 280 are alternatively arranged along the second lateral direction. Each first spacer 270 is located between the curved sidewalls of the semiconductor bodies 222 of two adjacent rows of vertical transistors 220. Each second spacer 280 is located between the flat sidewalls of the semiconductor bodies 222 of two adjacent rows of vertical transistors 220. That is, each semiconductor body 222 can include a flat sidewall facing the second spacer 280 and a curved sidewall facing the first spacer 270.

In some implementations, the gate structure 225 of each vertical transistor 220 can surround multiple sides of semiconductor body 222, i.e., surrounding the active region in which channels are formed from multiple lateral directions. In other words, the active region of vertical transistor 220, i.e., semiconductor body 222, can be at least partially surrounded by gate structure 225. For example, as shown in FIG. 3A, the vertical transistor can be a three-sided gate transistor in which gate structure 225 surrounds the semiconductor body 222 from three lateral directions. The three-sided gate structure 225 can surround the curved sidewall of the semiconductor body 222. Thus, a larger active channel region can be formed between the source and drain in operation to generate a larger gate control area for achieving better channel control with a smaller subthreshold swing. During the off state, since the channel is fully depleted, the leakage current ($I_{off}$) of vertical transistor 220 can be significantly reduced.

As shown in FIG. 3A, the three-sided gate structure 225 of adjacent vertical transistors 220 in the first lateral direction (i.e., the word line direction or the x-direction) are continuous, e.g., parts of a continuous conductive layer having three-sided gate structure 225. That is, multiple three-sided gate structures 225 of a row (e.g., 211-216) of vertical transistors 220 can be connected with each other and extending along the first lateral direction to form a word line 250 of the row of vertical transistors 220. In some implementations, a gate dielectric 224 is laterally between the three-sided gate structure 225 and the curved sidewall of the semiconductor body 222. The gate dielectrics 224 of adjacent vertical transistors 220 in the word line direction are separate, e.g., not parts of a continuous dielectric layer having gate dielectrics 224.

In a fifth example as shown in FIG. 3B, the cross-section of two semiconductor bodies 222 of two adjacent vertical transistors 220 in the third lateral direction and laterally separated by a second spacer 280 can be portions of an oval-like shape with a longitudinal axis along the third lateral direction (w-direction). That is, the two semiconductor bodies 222 within a pair of vertical transistors 220 can be laterally separated by a first spacer 270, and the semiconductor bodies 222 between adjacent pairs of vertical transistors 220 along the second lateral direction (y-direction) can be laterally separated by a second spacer 280. The plurality of first spacers 270 and second spacers 280 extend in parallel along the first lateral direction, and are alternatively arranged along the second lateral direction. That is, each semiconductor body 222 can include a flat sidewall facing the second spacer 280 and a curved sidewall facing the first spacer 270.

In some implementations, the gate structure 225 of each vertical transistor 220 is located beside the flat sidewall of the semiconductor body 222. The gate structures 225 of each row of vertical transistors 220 along the first lateral direction (x-direction) are connected with each other and form a word line 250 extending along the first lateral direction. The two word lines 250 of two adjacent rows of vertical transistors 220 that form pairs of vertical transistors can be embedded in a same second spacer 280 separating the two adjacent rows of vertical transistors 220, as shown in FIG. 3B. In some implementations, a gate dielectric 224 is laterally between the gate structure 225 and the flat sidewall of the semiconductor body 222.

In some implementations as shown in FIGS. 3A-3B, the semiconductor bodies 222 are aligned along the third lateral direction (w-direction) with non-zero angles in respect to the first lateral direction and the second lateral direction. As described in detail with the fabricating processed below, the semiconductor bodies 222 of a pair of vertical transistors 220 can be portions of a semiconductor pillar separated by a second spacer 280. The semiconductor pillar can have a rectangular-like shape or an oval shape with a longitudinal axis along the third lateral direction.

In some implementations, a first angle between the first lateral direction (x-direction) and the third lateral direction (w-direction), as well as a second angle between the second lateral direction (y-direction) and the third lateral direction (w-direction), can be determined by a first distance between adjacent bit lines 260 and a second distance between adjacent word lines 250. Specifically, a cotangent function of the first angle, or a tangent function of the second angle, can be approximately proportional to a first distance between adjacent bit lines, and reversely proportional to a double value of a second distance between adjacent word lines.

By aligning the semiconductor bodies 222 along the third lateral direction different from the first and second lateral direction, the first distance between adjacent bit lines 260 and the second distance between adjacent word lines 250 can be reduced to increase memory area inefficiencies. For example, when the first distance decreases by about 30%, the second angle can be about 25°, and the memory area can be reduced by about 25% to contain a same number of memory cells 210. As another example, when the first distance decreases by about 50%, the second angle can be about 22°, and the memory area can be reduced by about 30% to contain a same number of memory cells 210.

Referring to FIG. 3C, a schematic side view of a cross-section of a pair of memory cells 210 is shown according to some implementations of the present disclosure. It is noted that, the cross-section 300C can be a pair of memory cells 210 in any one of the 3D memory devices 300A and 300B, as shown in FIGS. 3A-3B. It is also noted that, the cross-section 300C is a vertical plane along the third lateral direction (the BB' line in FIGS. 3A-3B) and the vertical direction (z-direction). In the third lateral direction, the two semiconductor bodies 222 of a pair of vertical transistors 220 are located between the two gate structures 225, and are separated by first spacer 270 or second spacer 280 with one or more air gaps embedded therein.

As shown in FIG. 3C, each vertical transistor 220 can include a pair of a source and a drain 227, 228 (S/D, dope regions, a.k.a., source electrode and drain electrode) formed at the two ends of semiconductor body 222 in the vertical direction (the z-direction), respectively. The source and drain 227, 228 can be doped with any suitable P-type dopants, such as boron (B) or Gallium (Ga), or any suitable N-type dopants, such as phosphorus (P) or arsenic (As). In each vertical transistor 220, the source and drain 227, 228 can be separated at two ends of the semiconductor body 222 in the vertical direction (the z-direction). Gate structure 225 is formed vertically corresponding to the portion of the semiconductor body 222 between the source and drain 227, 228. As a result, the channel of the vertical transistor 220 can be formed in semiconductor body 222 vertically between the source and drain 227, 228 when a gate voltage applied to the gate structure 225 is above the threshold voltage of the vertical transistor 220.

As shown in FIG. 3C, a pair of vertical transistors 220 can have separated sources/drains 228 connected to a storage unit (e.g., a capacitor 290) through a storage unit contact 298, and can also have a common source/drain 227 connected to a bit line 260 through a bit line contact 296. It is noted that the storage unit can include any devices that are capable of storing binary data (e.g., 0 and 1), including but not limited to, capacitors for DRAM cells and FRAM cells, and PCM elements for PCM cells. In some implementations, each vertical transistor 220 controls the selection and/or the state switch of the respective storage unit coupled to vertical transistor 220.

In some implementations as shown in FIG. 3C, the storage unit is a capacitor 290 including a first electrode (not shown) coupled with the source/drain 228 of vertical transistor 220. Capacitor 290 can also include a capacitor dielectric (not shown) in contact with the first electrode, and a second electrode (not shown) in contact with the capacitor dielectric. That is, capacitor 290 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, the two electrodes can include conductive materials including, but not limited to, W, Co, Cu, Al, TiN, TaN, polysilicon, silicides, or any combination thereof.

It is understood that the capacitor 290 may include any suitable structure and configuration, such as a planar capacitor, a stack capacitor, a multi-fins capacitor, a cylinder capacitor, a trench capacitor, or a substrate-plate capacitor. That is, capacitor 290 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground.

In some implementations, one or more peripheral circuits (not shown) can be coupled to memory cell array 300A/300B through bit lines 260, word lines 250, and any other suitable metal wirings. It is noted that the one or more peripheral circuits can include any suitable circuits for facilitating the operations of memory cell array 300A/200B/200C by applying and sensing voltage signals and/or current signals through word lines 250 and bit lines 260 to and from each memory cell 210. The one or more peripheral circuits can include various types of peripheral circuits formed using CMOS technologies.

Figure 4A:
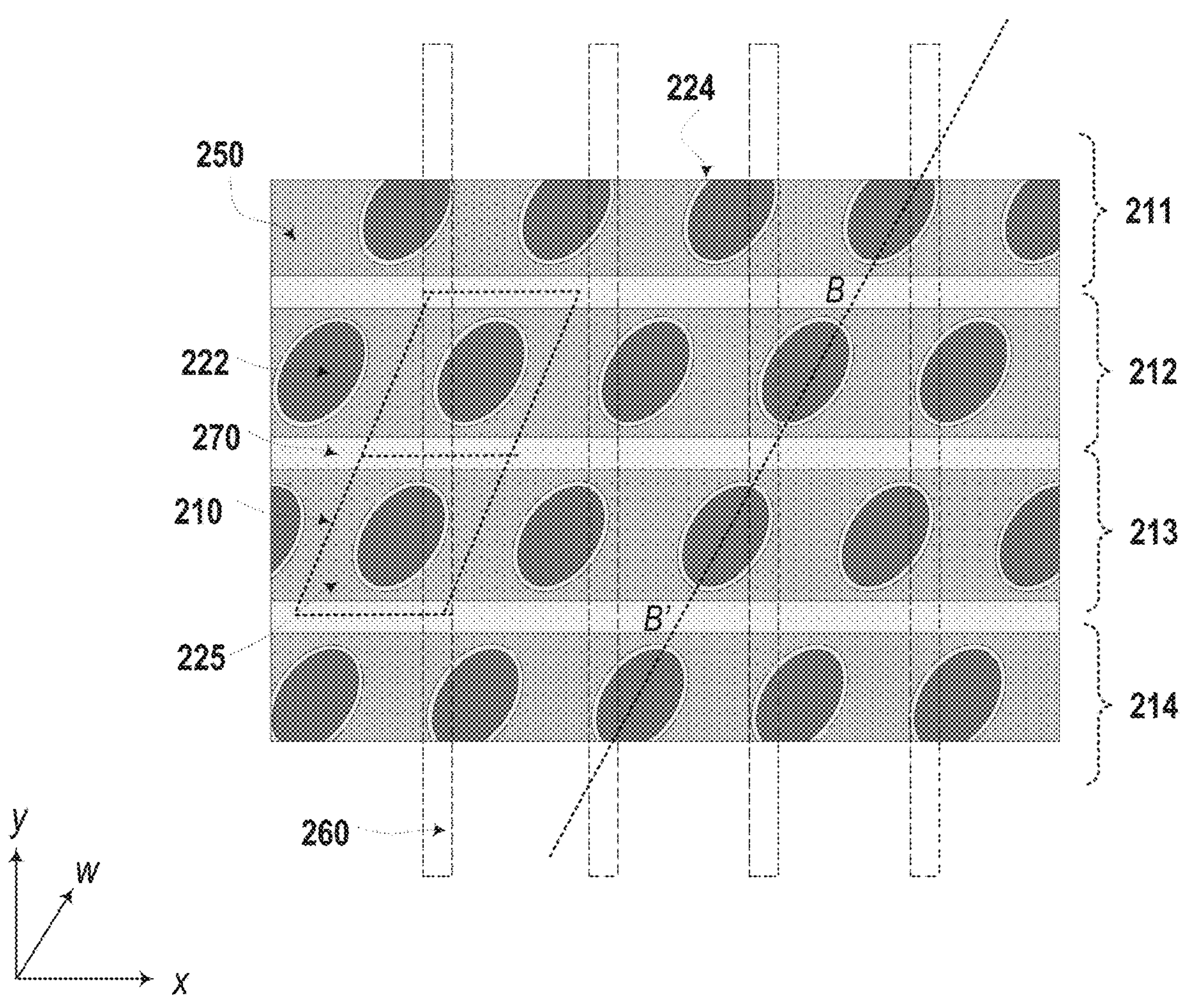
FIG. 4A illustrates a schematic plan view of an array of memory cells each including a vertical transistor in an exemplary memory device, according to various implementations of the present disclosure.
Figure 4B:
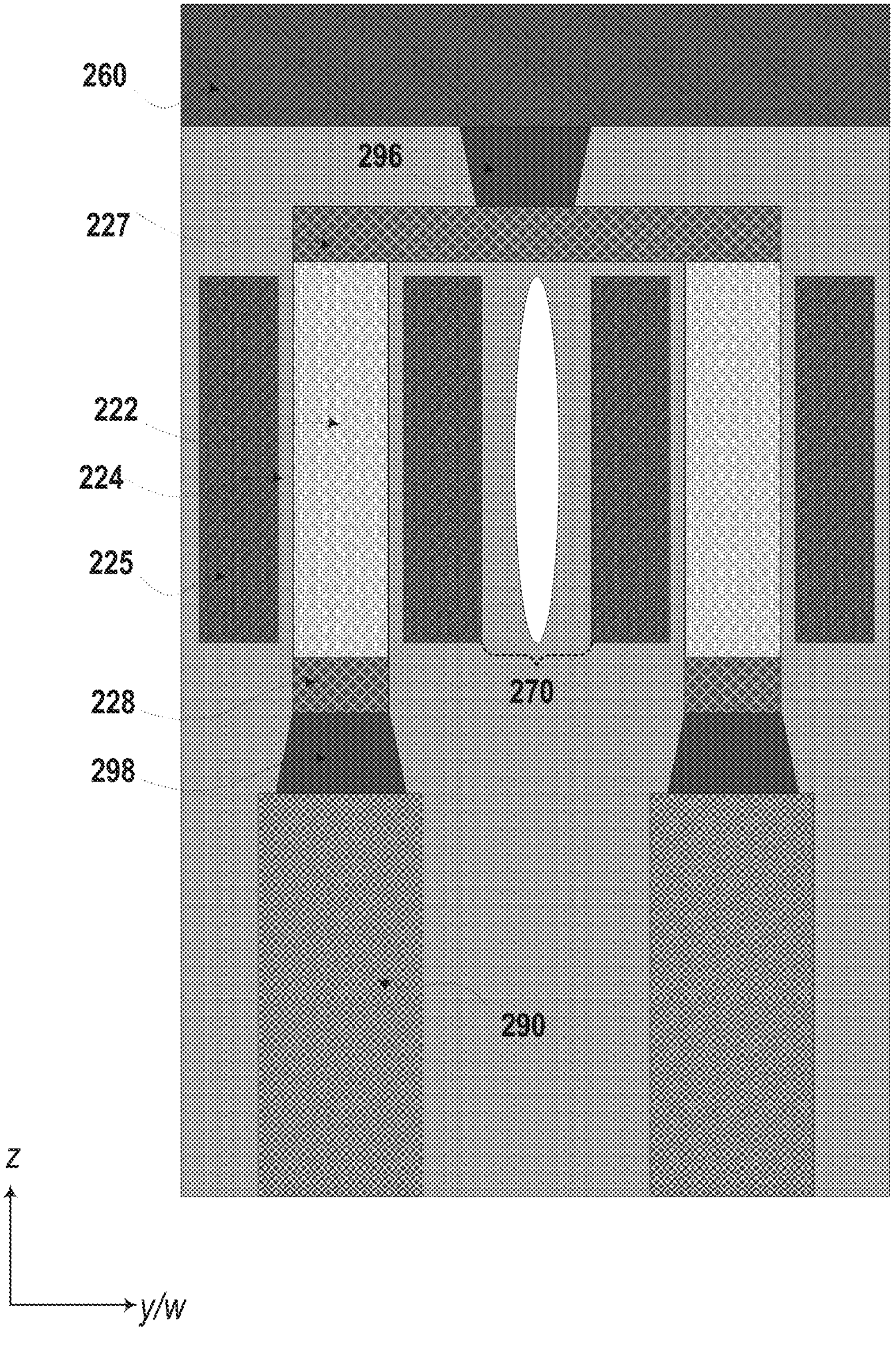
FIG. 4B illustrates a schematic side view of a cross-section of a pair of memory cells in an exemplary 3D memory device shown in FIG. 4A, according to some implementations of the present disclosure.

FIG. 4A illustrates a schematic plan view of an array of memory cells each including a vertical transistor in an exemplary memory device, according to some implementations of the present disclosure. FIG. 4B illustrates a schematic side view of a cross-section of a pair of memory cells 210 along the BB' line of FIG. 4A, according to some implementations of the present disclosure.

In a sixth example as shown in FIG. 4A, the cross-section of each semiconductor body 222 of a vertical transistor 220 can be an oval-like shape with a longitudinal axis along the third lateral direction (w-direction). In some implementations, a pair of vertical transistors 220 (included in the dotted lines) can share a common source/drain connected to a bit line 260. Adjacent rows of vertical transistors 220 that form pairs of vertical transistors 220 can sandwich a first spacer 270 extending in parallel along the first lateral direction (x-direction). Adjacent pairs of vertical transistors 220 along the second lateral direction (y-direction) can be separated by a second spacer 280 extending in parallel along the first lateral direction. A plurality of first spacers 270 and second spacers 280 can be alternatively arranged along the second lateral direction.

In some implementations, the gate structure 225 of each vertical transistor 220 can be an all-round gate structure laterally surrounding the semiconductor body 222, i.e., surrounding the active region in which a channel is formed from all lateral directions. In other words, the active region of vertical transistor 220, i.e., semiconductor body 222, can be entirely surrounded by the all-around gate structure 225. Thus, a larger active channel region can be formed between the source and drain in operation to generate a larger gate control area for achieving better channel control with a smaller subthreshold swing. During the off state, since the channel is fully depleted, the leakage current ($I_{off}$) of vertical transistor 220 can be significantly reduced. In some implementations, a gate dielectric 224 is laterally between the all-round gate structure 225 and the semiconductor body 222.

In some implementations as shown in FIG. 4A, the semiconductor bodies 222 are aligned along the third lateral direction (w-direction) with non-zero angles in respect to the first lateral direction and the second lateral direction. In some implementations, a first angle between the first lateral direction (x-direction) and the third lateral direction (w-direction) as well as a second angle between the second lateral direction (y-direction) and the third lateral direction (w'-direction) can be determined by a first distance between adjacent bit lines 260 and a second distance between adjacent word lines 250. Specifically, a cotangent function of the first angle, or a tangent function of the second angle, can be approximately proportional to a first distance between adjacent bit lines, and reversely proportional to a double value of a second distance between adjacent word lines.

By aligning the semiconductor bodies 222 along the third lateral direction different from the first and second lateral direction, the first distance between adjacent bit lines 260 and the second distance between adjacent word lines 250 can be reduced to increase memory area inefficiencies. For example, when the first distance decreases by about 30%, the second angle can be about 25°, and the memory area can be reduced by about 25% to contain a same number of memory cells 210. As another example, when the first distance decreases by about 50%, the second angle can be about 22°, and the memory area can be reduced by about 30% to contain a same number of memory cells 210.

Referring to FIG. 4B, a schematic side view of a cross-section of a pair of memory cells 210 of the 3D memory device 400A is shown according to some implementations of the present disclosure. The cross-section 400B is a vertical plane along the third lateral direction (the BB' line in FIG. 4A) and the vertical direction (z-direction). In the third lateral direction, the gate structures 225 are located at both sides of the two semiconductor bodies 222 of a pair of vertical transistors 220. The pair of vertical transistors 220 are separated by first spacer 270 with one or more air gaps embedded therein.

As shown in FIG. 4B, each vertical transistor 220 can include a pair of a source and a drain 227, 228 (S/D, dope regions, a.k.a., source electrode and drain electrode) formed at the two ends of semiconductor body 222 in the vertical direction (the z-direction), respectively. The source and drain 227, 228 can be doped with any suitable P-type dopants, such as boron (B) or Gallium (Ga), or any suitable N-type dopants, such as phosphorus (P) or arsenic (As). In each vertical transistor 220, the source and drain 227, 228 can be separated at two ends of the semiconductor body 222 in the vertical direction (the z-direction). Gate structure 225 is formed vertically corresponding to the portion of the semiconductor body 222 between the source and drain 227, 228. As a result, the channel of the vertical transistor 220 can be formed in semiconductor body 222 vertically between the source and drain 227, 228 when a gate voltage applied to the gate structure 225 is above the threshold voltage of the vertical transistor 220.

As shown in FIG. 4B, a pair of vertical transistors 220 can have separated sources/drains 228 connected to a storage unit (e.g., a capacitor 290) through a storage unit contact 298, and can also have a common source/drain 227 connected to a bit line 260 through a bit line contact 296. It is noted that the storage unit can include any devices that are capable of storing binary data (e.g., 0 and 1), including but not limited to, capacitors for DRAM cells and FRAM cells, and PCM elements for PCM cells. In some implementations, each vertical transistor 220 controls the selection and/or the state switch of the respective storage unit coupled to vertical transistor 220.

In some implementations as shown in FIG. 4B, the storage unit is a capacitor 290 including a first electrode (not shown) coupled with the source/drain 228 of vertical transistor 220. Capacitor 290 can also include a capacitor dielectric (not shown) in contact with the first electrode, and a second electrode (not shown) in contact with the capacitor dielectric. That is, capacitor 290 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, the two electrodes can include conductive materials including, but not limited to, W, Co, Cu, Al, TiN, TaN, polysilicon, silicides, or any combination thereof.

It is understood that the capacitor 290 may include any suitable structure and configuration, such as a planar capacitor, a stack capacitor, a multi-fins capacitor, a cylinder capacitor, a trench capacitor, or a substrate-plate capacitor. That is, capacitor 290 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground.

In some implementations, one or more peripheral circuits (not shown) can be coupled to memory cell array 300A/300B through bit lines 260, word lines 250, and any other suitable metal wirings. It is noted that the one or more peripheral circuits can include any suitable circuits for facilitating the operations of memory cell array 300A/200B/200C by applying and sensing voltage signals and/or current signals through word lines 250 and bit lines 260 to and from each memory cell 210. The one or more peripheral circuits can include various types of peripheral circuits formed using CMOS technologies.

Figure 5:
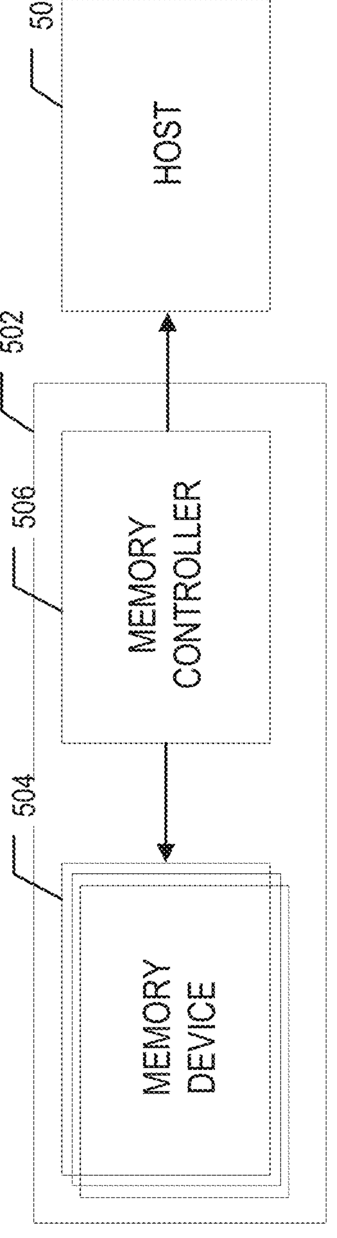
FIG. 5 illustrates a block diagram of an exemplary system having a memory device, according to some implementations of the present disclosure.

FIG. 5 illustrates a block diagram of a system 500 having a memory device, according to some implementations of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive the data to or from memory devices 504. Memory device 504 can be any memory devices disclosed herein, such as memory device 100. In some implementations, memory device 504 includes an array of memory cells shown in 200A/200B/200C/300A/300B/400A each including a vertical transistor 220, as described above in detail.

Memory controller 506 is coupled to memory device 504 and host 508 and is configured to control memory device 504, according to some implementations. Memory controller 506 can manage the data stored in memory device 504 and communicate with host 508. Memory controller 506 can be configured to control operations of memory device 504, such as read, write, and refresh operations. Memory controller 506 can also be configured to manage various functions with respect to the data stored or to be stored in memory device 504 including, but not limited to refresh and timing control, command/request translation, buffer and schedule, and power management. In some implementations, memory controller 506 is further configured to determine the maximum memory capacity that the computer system can use, the number of memory banks, memory type and speed, memory particle data depth and data width, and other important parameters. Any other suitable functions may be performed by memory controller 506 as well. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 6:
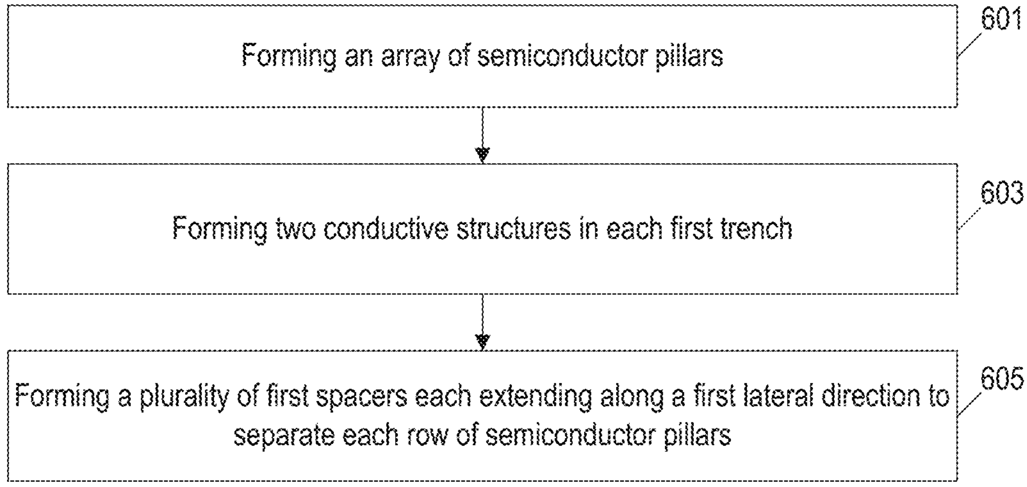
FIG. 6 illustrates a flowchart of an exemplary fabricating method for forming a 3D memory device including vertical transistors, according to some implementations of the present disclosure.

FIG. 6 illustrates a flowchart of an exemplary fabricating method 600 for forming a 3D memory device including vertical transistors, such as memory device 200B described above in connection with FIGS. 2B and 2D, according to some implementations of the present disclosure. FIGS. 7A-7B, 8A-8B, 9A-9B, 10A-10B, and 11A-11B illustrate schematic plan views and schematic side cross-sectional views of an exemplary 3D memory device at certain fabricating stages of the method 600 shown in FIG. 6, according to various implementations of the present disclosure. It is understood that the operations shown in method 600 are not exhaustive and that other operations can be performed as well before, after, or between any of the illustrated operations. Further, some of the operations may be performed simultaneously, or in a different order than shown in FIG. 6.

As shown in FIG. 6, method 600 can start at operation 601, in which an array of semiconductor pillars can be formed. In some embodiments, the array of semiconductor pillars can be formed in an upper portion of a semiconductor layer. Each semiconductor pillar can extend vertically (in the z-direction) and have any suitable 3D shape, such as polyhedron shapes or a cylinder shape. That is, the cross-section of each semiconductor pillar in the plan view (e.g., in the x-y plane) can have a square shape, a rectangular shape (or a trapezoidal shape), a circular shape, an oval shape, or any other suitable shapes.

Figure 7A:
FIG. 7A illustrates a schematic plan view of an exemplary 3D memory device at a certain fabricating stage of the method shown in FIG. 6, according to various implementations of the present disclosure.
Figure 7A:
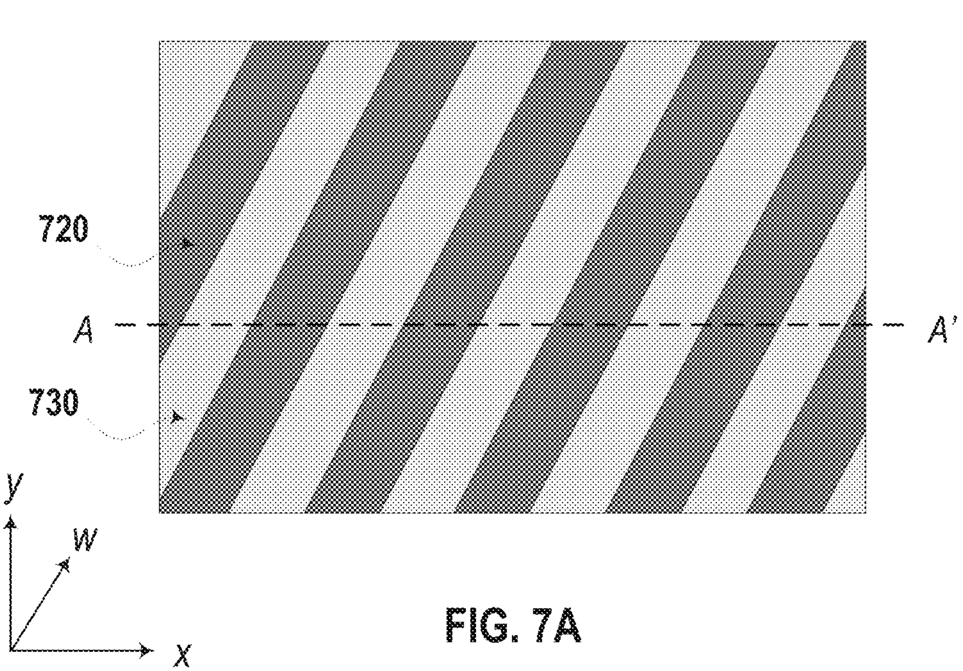
Figure 7B:
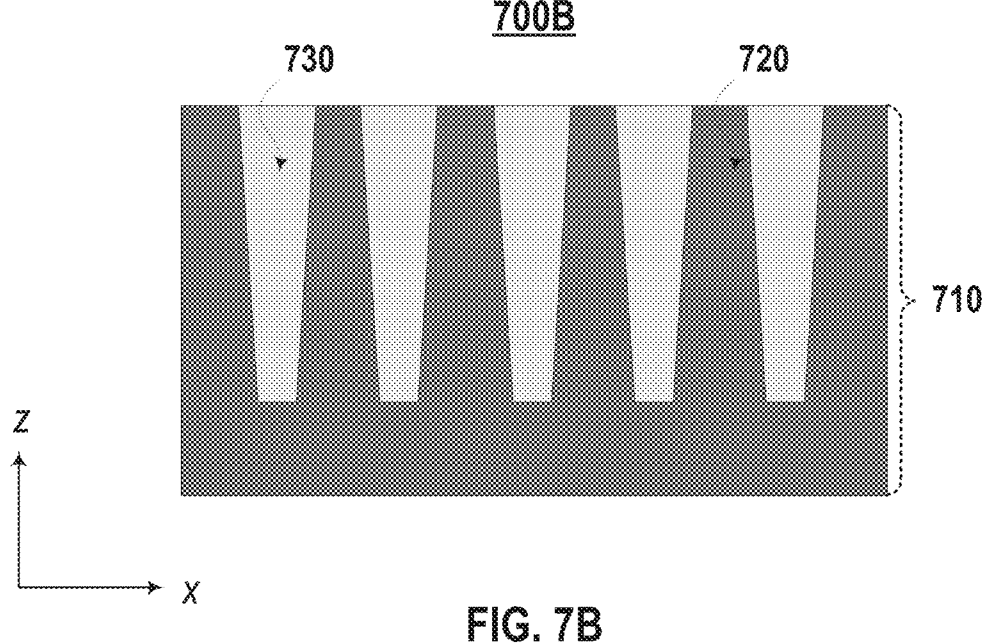
FIG. 7B illustrates a schematic side cross-sectional view of an exemplary 3D memory device at a certain fabricating stage of the method shown in FIG. 6, according to various implementations of the present disclosure.

In some implementations, forming the array of semiconductor pillars can include forming a plurality of semiconductor walls 720 separated by a plurality of parallel third spacers 730, as shown in FIGS. 7A and 7B. The plurality of semiconductor walls 720 and third spacers 730 each laterally extends along a third lateral direction (w-direction). Forming the plurality of semiconductor walls 720 and the plurality of parallel third spacers 730 can include forming a plurality of third trenches vertically extend into an upper portion of a semiconductor layer 710 (e.g., a silicon substrate) as illustrated in a side view of FIG. 7B along AA' line shown in FIG. 7A. The remaining portions of the upper portion of the semiconductor layer 710 form the plurality of semiconductor walls 720.

In some implementations, a lithography process is performed to pattern the plurality of third trenches using an etch mask (e.g., a photoresist mask and/or a hard mask), and one or more dry etching and/or wet etching processes, such as RIE, are performed to etch the plurality of third trenches in the upper portion of the semiconductor layer 710. Since semiconductor walls 720 are formed by etching semiconductor layer 710, semiconductor walls 720 can have the same material as semiconductor layer 710, such as single crystalline silicon. Then the third spacers 730 can be formed by depositing a dielectric material, such as silicon oxide, to fill the third trenches, using a thin film deposition process including, but not limited to, CVD, PVD, ALD, or any combination thereof. A planarization process can be performed to remove excess dielectric over the top surface of semiconductor layer 710.

Figure 8A:
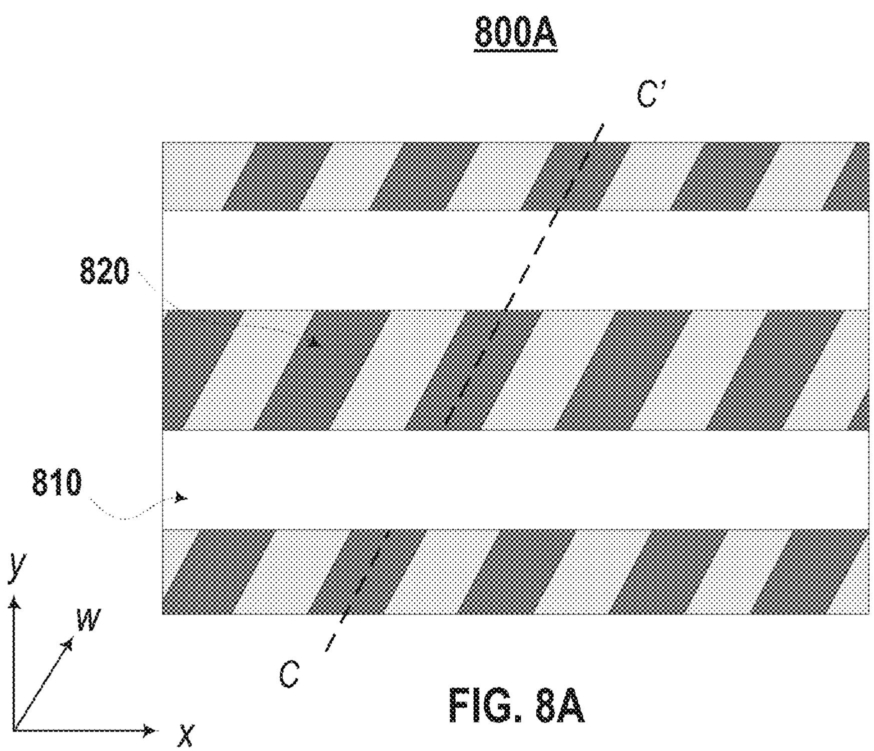
FIG. 8A illustrates a schematic plan view of an exemplary 3D memory device at a certain fabricating stage of the method shown in FIG. 8, according to various implementations of the present disclosure.
Figure 8B:
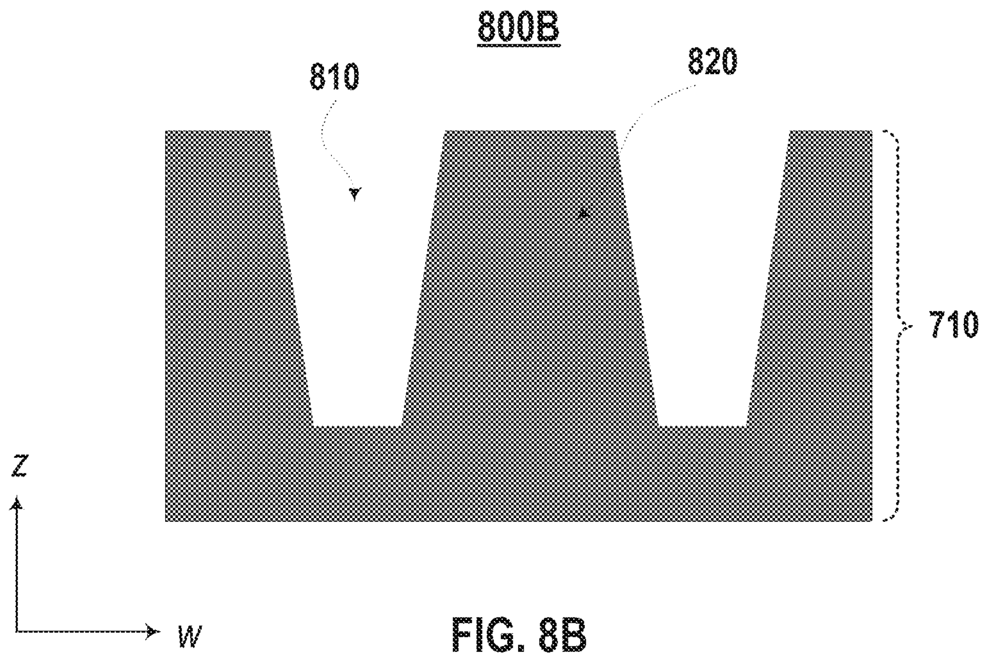
FIG. 8B illustrates a schematic side cross-sectional view of an exemplary 3D memory device at a certain fabricating stage of the method shown in FIG. 8, according to various implementations of the present disclosure.

In some implementations, forming the array of semiconductor pillars can further include forming a plurality of parallel first trenches 810 extending along a first lateral direction (x-direction), as shown in FIGS. 8A and 8B. The plurality of parallel first trenches 810 can vertically extend into upper portions of the semiconductor layer 710 as illustrated in a side view of FIG. 8B along CC' line (along the w-direction) shown in FIG. 8A. The plurality of the semiconductor walls 720 can be separated by the plurality of first trenches 810 into an array of semiconductor pillars 820. In some implementations, a lithography process is performed to pattern the plurality of first trenches using an etch mask (e.g., a photoresist mask and/or a hard mask), and one or more dry etching and/or wet etching processes, such as RIE, are performed to etch the plurality of third trenches in the upper portion of the semiconductor layer 710.

Referring back to FIG. 6, method 600 can proceed to operation 603, in which two conductive structures can be formed in each first trench. In some implementations, each conductive structure can be isolated from an adjacent row of semiconductor pillars by a gate dielectric layer.

Figure 9A:
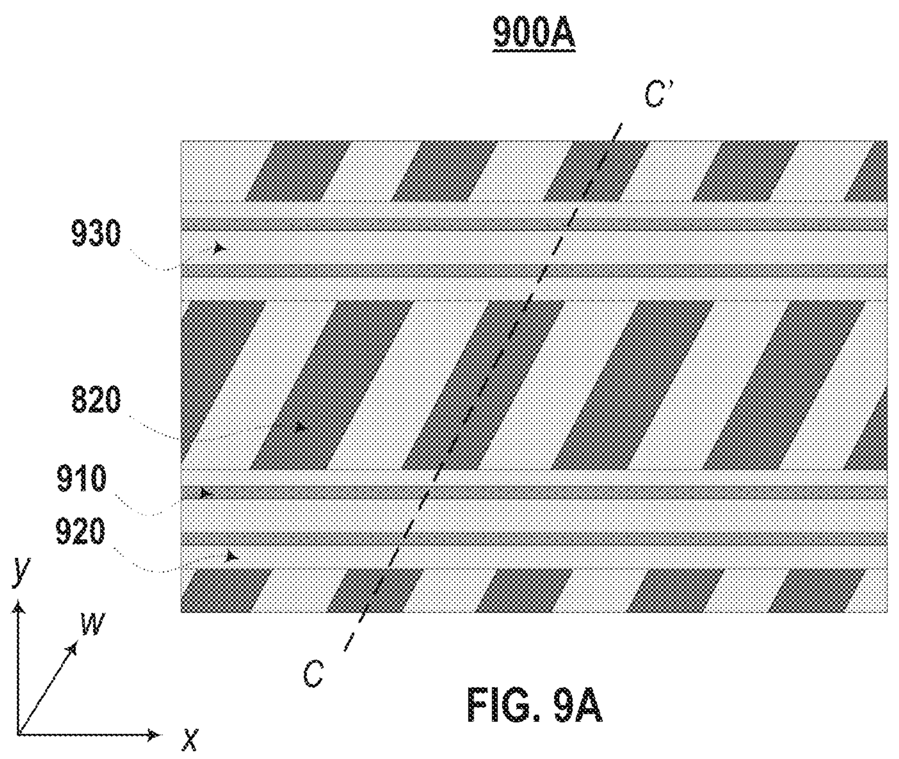
FIG. 9A illustrates a schematic plan view of an exemplary 3D memory device at a certain fabricating stage of the method shown in FIG. 6, according to various implementations of the present disclosure.
Figure 9B:
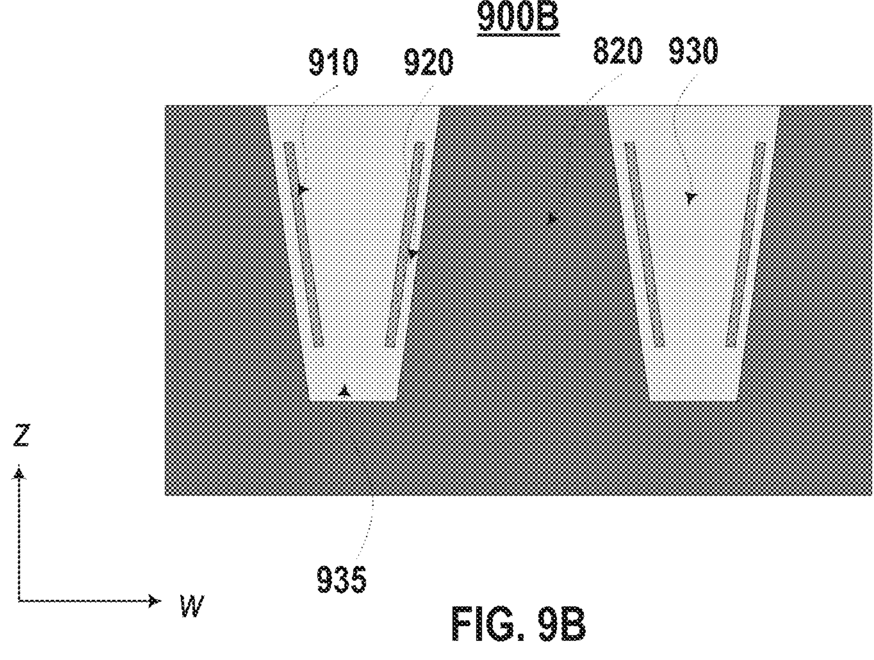
FIG. 9B illustrates a schematic side cross-sectional view of an exemplary 3D memory device at a certain fabricating stage of the method shown in FIG. 6, according to various implementations of the present disclosure.

In some implementations, before forming the conductive structure, a lower trench isolation structure can be formed in the bottom of the first trenches. As shown in FIG. 9B, a lower trench isolation structure 935 is formed at a bottom of each first trench 810. In some implementations, a dielectric, such as silicon oxide, is deposited to fully fill the first trenches 810 using one or more thin film deposition processes including, but not limited to, CVD, PVD, ALD, a spin coating process, or any combination thereof. In some implementations, an etch-back process, is performed to remove upper portions of the dielectric, such that the remaining portion of the dielectric form the lower trench isolation structure 935 located at a bottom portion of the first trenches 810.

In some implementations, a gate dielectric layer 920 can be formed to cover the exposed sidewalls of the semiconductor pillars 820. As illustrated in FIGS. 9A and 9B, the gate dielectric layer 920 can cover the sidewalls of each semiconductor pillar 820 exposed by the first trenches 810. In some implementations, the gate dielectric layer 920 is formed by depositing a layer of dielectric, such as silicon oxide, over the sidewalls of each semiconductor pillar 820 using one or more thin film deposition processes including, but not limited to, CVD, PVD, ALD, or any combination thereof. It some other implementations, the gate dielectric layer 920 is formed by a wet oxidation and/or a dry oxidation process, such as in situ steam generation (ISSG) oxidation, is performed to form native oxide (e.g., silicon oxide) on exposed sidewalls of the semiconductor pillars 820 (e.g., single crystalline silicon) as the gate dielectric layer 920.

After forming the gate dielectric layer, a conductive layer is formed in the first trenches 810. In some implementations, to form the conductive layer, one or more conductive films are deposited in the first trenches 810 and over the gate dielectric layer 920. In some implementations, the conductive layer can be formed by depositing one or more conductive materials, such as metal and/or metal compounds (e.g., W and TiN), over the gate dielectric layer 920 using one or more thin film deposition processes including, but not limited to, CVD, PVD, ALD, or any combination thereof, to partially fill the first trenches 810. For example, layers of TiN and W may be sequentially deposited to form the conductive structure. A planarization process, e.g., CMP, can be performed to remove the excess conductive materials over the top surface of semiconductor layer 710.

After forming the conductive layer, a plurality of second spacers 930 each extending along the first lateral direction (x-direction) can be formed to separate the conductor layer into two conductive structures 910 each extending along the first lateral direction. In some implementations, to form the plurality of second spacers 930, the conductive layer is patterned and etched to form a plurality of third trenches (not shown) each vertically extending between adjacent sidewalls of the conductive layer on the sidewalls of each first trench 810, and laterally extending parallel along the first lateral direction (x-direction). In some implementations, the conductive structures 910 are etched back, for example, using dry etch and/or wet etch (e.g., RIE), to form dents, such that the upper end of the conductive structure 910 is below the top surface of semiconductor pillars 820. In some implementations, as the gate dielectric layer 920 is not etched back, the upper end of the conductive structure 910 is below the upper end of the gate dielectric layer 920 as well, which is flush with the top surface of semiconductor pillars 820.

In some implementations, as shown in FIGS. 9A and 9B, a dielectric material, such as silicon oxide, is deposited in the remaining space of third trenches as well as the dents (not shown) to form the plurality of third spacers 930, using one or more thin film deposition processes including, but not limited to, CVD, PVD, ALD, or any combination thereof. In some implementations, forming the plurality of third spacers 930 can include forming one or more air gaps (not shown) embedded in the dielectric material. The one or more air gaps can be formed due to the relatively small pitches of the third spacers in the second lateral direction. The relatively large dielectric constant of air in air gaps (e.g., about 4 times the dielectric constant of silicon oxide) can improve the insulation effect between separated conductive material(s) and semiconductive material(s) compared with some dielectrics (e.g., silicon oxide).

Referring back to FIG. 6, method 600 can then proceed to operation 605, in which a plurality of first spacers each extending along the first lateral direction can be formed to separate each row of the array of semiconductor pillars to form two rows of semiconductor bodies.

Figure 10A:
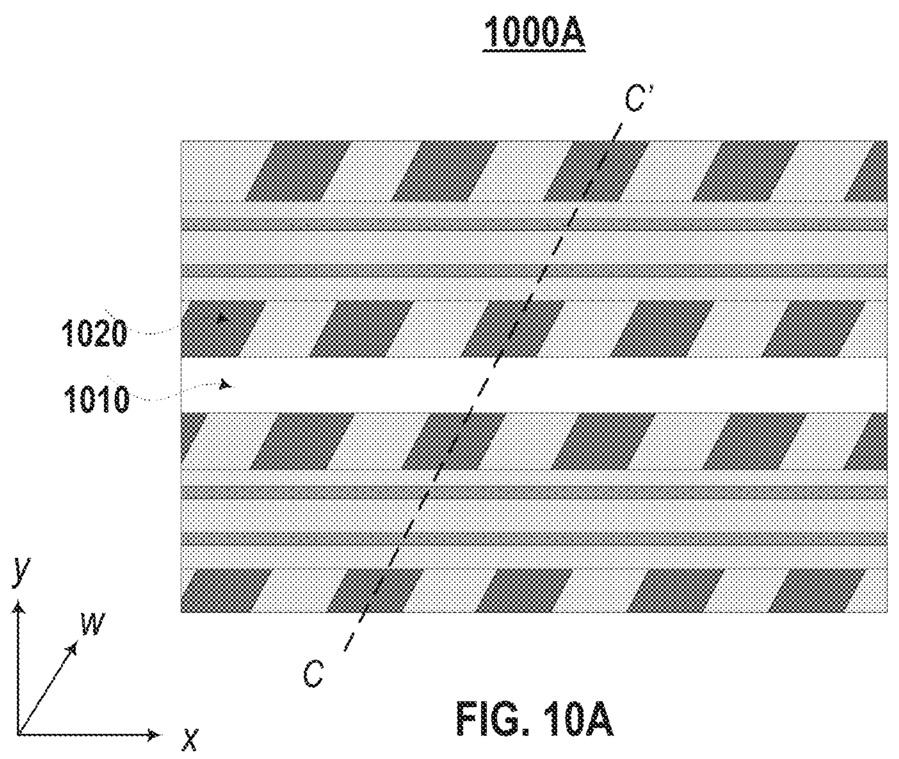
FIG. 10A illustrates a schematic plan view of an exemplary 3D memory device at a certain fabricating stage of the method shown in FIG. 6, according to various implementations of the present disclosure.
Figure 10B:
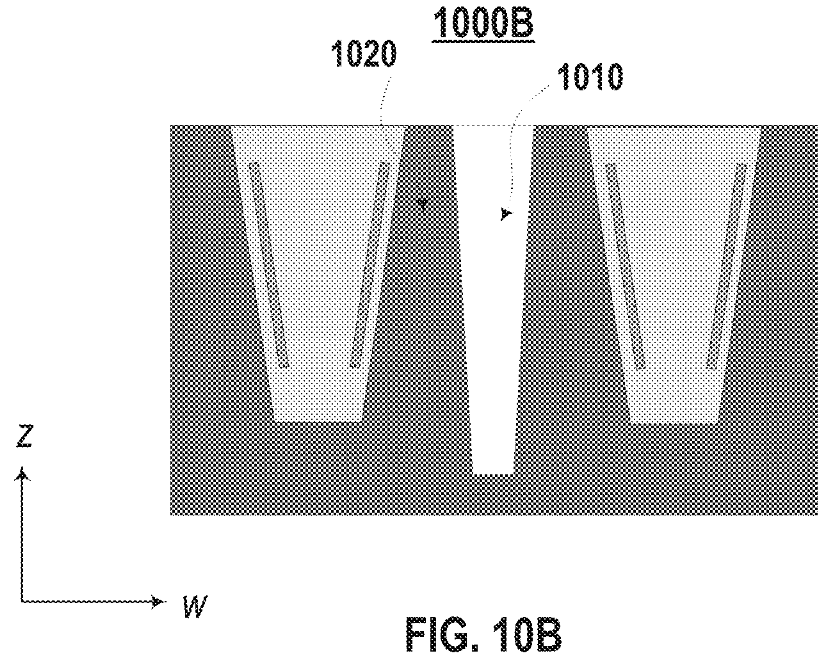
FIG. 10B illustrates a schematic side cross-sectional view of an exemplary 3D memory device at a certain fabricating stage of the method shown in FIG. 6, according to various implementations of the present disclosure.

In some implementations as shown in FIGS. 10A and 10B, forming the plurality of first spacers includes forming a plurality of fourth trenches 1010 each extending along the first lateral direction (x-direction) to separate each row of the array of semiconductor pillars 820 into two rows of semiconductor bodies 1020. In some implementations, a lithography process can be applied to pattern the fourth trenches on the array of semiconductor pillars 820 using an etch mask (e.g., a photoresist mask and/or a hard mask), and one or more dry etching and/or wet etching processes, such as RIE, are performed on the array of semiconductor pillars 820 to etch the fourth trenches 1010. The etching can be controlled such that a depth of the fourth trenches can be greater than the depth of the first trenches 810.

Figure 11A:
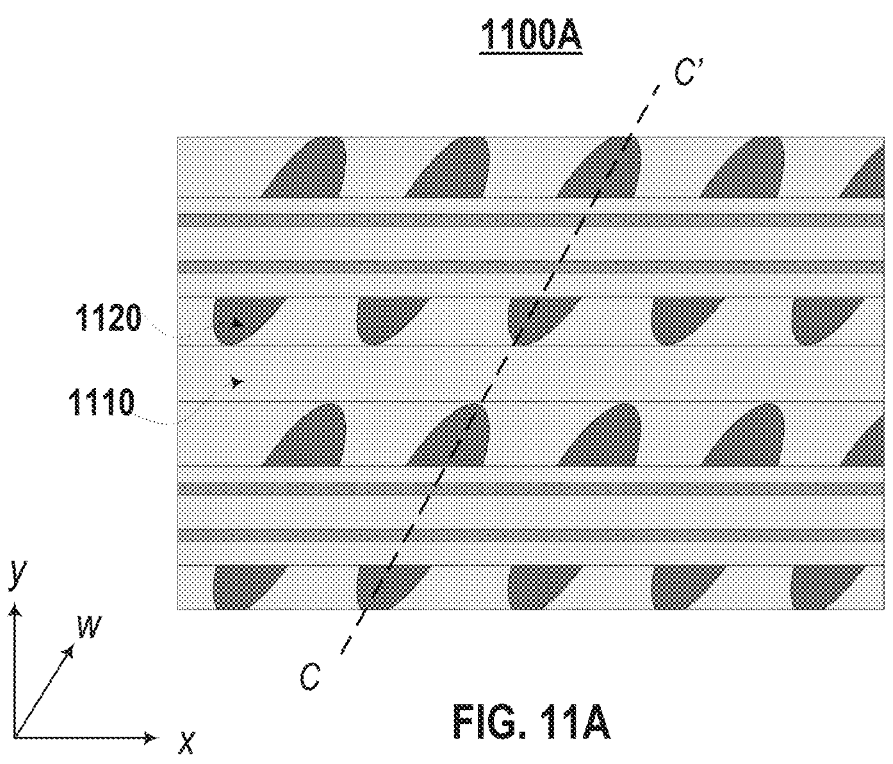
FIG. 11A illustrates a schematic plan view of an exemplary 3D memory device at a certain fabricating stage of the method shown in FIG. 6, according to various implementations of the present disclosure.
Figure 11B:
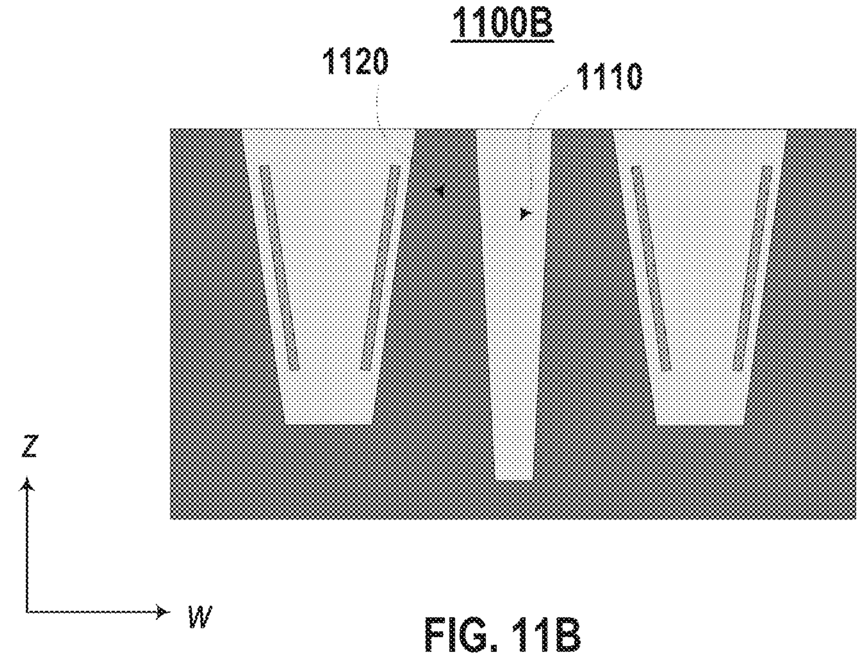
FIG. 11B illustrates a schematic side cross-sectional view of an exemplary 3D memory device at a certain fabricating stage of the method shown in FIG. 6, according to various implementations of the present disclosure.

In some implementations as shown in FIGS. 11A and 11B, after forming the fourth trenches 1010, portions of the third spacers 730 exposed by the fourth trenches 1010 can be removed, and portions of each of the array of semiconductor bodies 1020 can be removed by one or more etching processes, such as wet etching, such that the lateral corners of each semiconductor body 1020 exposed by the fourth trench 1010 are rounded. As such, each of the array of semiconductor pillars 1120 has a curved sidewall exposed by the fourth trenches 1010. Next, a plurality of first spacers 1110 can be formed to fill the plurality of fourth trenches 1010, for example, by depositing a dielectric material, such as silicon oxide, to fill the third and fourth trenches, using one or more thin film deposition processes including, but not limited to, CVD, PVD, ALD, or any combination thereof.

In some implementations, forming the plurality of first spacers 1110 can include forming one or more air gaps (not shown) embedded in the dielectric material. The one or more air gaps can be formed due to the relatively small pitches of the first spacers 1110 in the second lateral direction. The relatively large dielectric constant of air in air gaps (e.g., about 4 times the dielectric constant of silicon oxide) can improve the insulation effect between separated conductive material(s) and semiconductive material(s) compared with some dielectrics (e.g., silicon oxide).

It is noted that, any suitable operations can be performed about operation 605 to further fabricating the memory device. For example, both ends of the semiconductor body 1120 can be doped to form the source and drain. As another example, a plurality of storage units, such as a plurality of capacitors can be formed to electrically coupled with one of source/drain of each semiconductor body 1120. As yet another example, a plurality of bit lines can be formed to electrically coupled with the other one of source/drain of each semiconductor body 1120.

Figure 12:
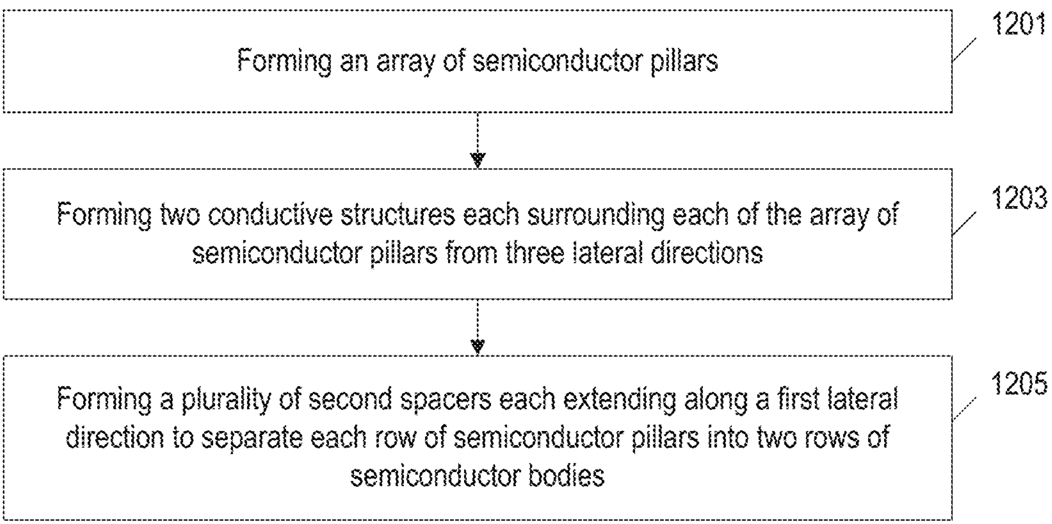
FIG. 12 illustrates a flowchart of an exemplary fabricating method for forming a 3D memory device including vertical transistors, according to some implementations of the present disclosure.

FIG. 12 illustrates a flowchart of an exemplary fabricating method 1200 for forming a 3D memory device including vertical transistors, such as memory device 300B described above in connection with FIGS. 3B and 3C, according to some implementations of the present disclosure. FIGS. 13A-13B, 14A-14B, 15A-15B, 16A-16B and 17A-17B illustrate schematic plan views and schematic side cross-sectional views of an exemplary 3D memory device at certain fabricating stages of the method 1200 shown in FIG. 12, according to various implementations of the present disclosure. It is understood that the operations shown in method 1200 are not exhaustive and that other operations can be performed as well before, after, or between any of the illustrated operations. Further, some of the operations may be performed simultaneously, or in a different order than shown in FIG. 12.

As shown in FIG. 12, method 1200 can start at operation 1201, in which an array of semiconductor pillars can be formed. In some embodiments, the array of semiconductor pillars can be formed in an upper portion of a semiconductor layer. Each semiconductor pillar can extend vertically (in the z-direction) and have any suitable 3D shape, such as polyhedron shapes or a cylinder shape. That is, the cross-section of each semiconductor pillar in the plan view (e.g., in the x-y plane) can have a square shape, a rectangular shape (or a trapezoidal shape), a circular shape, an oval shape, or any other suitable shapes.

Figure 13A:
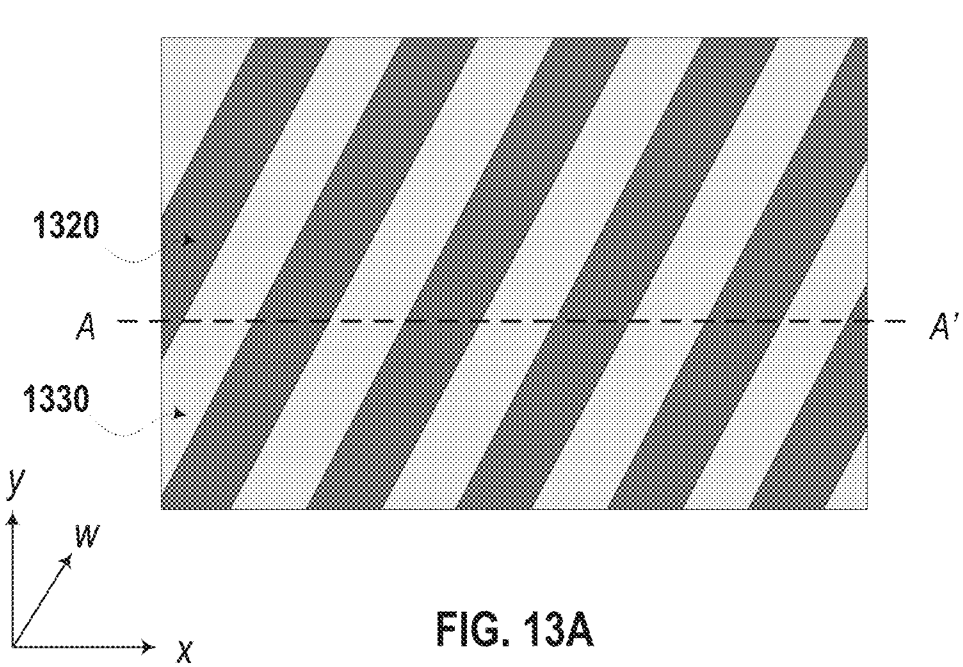
FIG. 13A illustrates a schematic plan view of an exemplary 3D memory device at a certain fabricating stage of the method shown in FIG. 12, according to various implementations of the present disclosure.
Figure 13B:
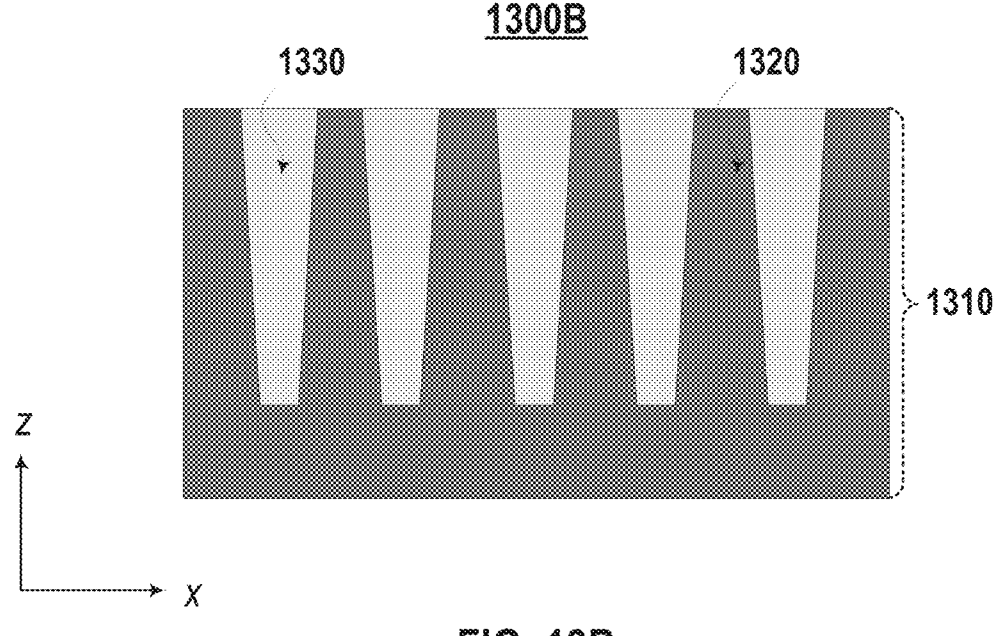
FIG. 13B illustrates a schematic side cross-sectional view of an exemplary 3D memory device at a certain fabricating stage of the method shown in FIG. 12, according to various implementations of the present disclosure.

In some implementations, forming the array of semiconductor pillars can include forming a plurality of semiconductor walls 1320 separated by a plurality of parallel third spacers 1330, as shown in FIGS. 13A and 13B. The plurality of semiconductor walls 1320 and third spacers 1330 each laterally extends along a third lateral direction (w-direction). Forming the plurality of semiconductor walls 720 and the plurality of parallel third spacers 1330 can include forming a plurality of third trenches vertically extend into an upper portion of a semiconductor layer 710 (e.g., a silicon substrate) as illustrated in a side view of FIG. 13B along AA' line shown in FIG. 13A. The remaining portions of the upper portion of the semiconductor layer 1310 form the plurality of semiconductor walls 1320.

In some implementations, a lithography process is performed to pattern the plurality of third trenches using an etch mask (e.g., a photoresist mask and/or a hard mask), and one or more dry etching and/or wet etching processes, such as RIE, are performed to etch the plurality of third trenches in the upper portion of the semiconductor layer 1310. Since semiconductor walls 1320 are formed by etching semiconductor layer 1310, semiconductor walls 1320 can have the same material as semiconductor layer 1310, such as single crystalline silicon. Then the third spacers 1330 can be formed by depositing a dielectric material, such as silicon oxide, to fill the third trenches, using a thin film deposition process including, but not limited to, CVD, PVD, ALD, or any combination thereof. A planarization process can be performed to remove excess dielectric over the top surface of the semiconductor layer 1310.

Figure 14A:
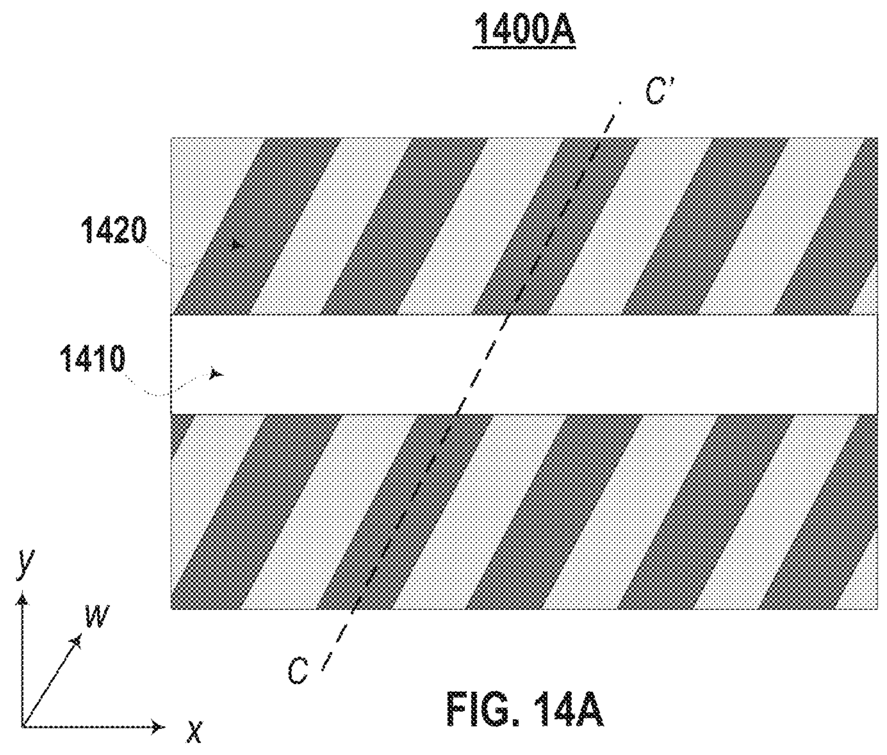
FIG. 14A illustrates a schematic plan view of an exemplary 3D memory device at a certain fabricating stage of the method shown in FIG. 12, according to various implementations of the present disclosure.
Figure 14B:
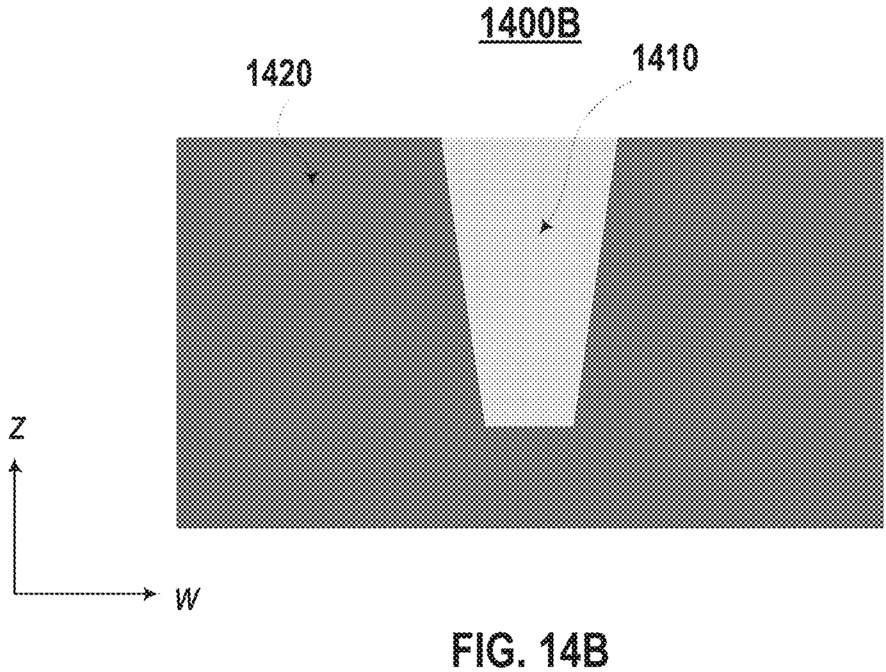
FIG. 14B illustrates a schematic side cross-sectional view of an exemplary 3D memory device at a certain fabricating stage of the method shown in FIG. 12, according to various implementations of the present disclosure.

In some implementations, forming the array of semiconductor pillars can further include forming a plurality of parallel first trenches 1410 extending along a first lateral direction (x-direction), as shown in FIGS. 14A and 14B. The plurality of parallel first trenches 1410 can vertically extend into upper portions of the semiconductor layer 1310 as illustrated in a side view of FIG. 14B along CC' line (along the w-direction) shown in FIG. 14A. The plurality of the semiconductor walls 1320 can be separated by the plurality of first trenches 1410 into an array of semiconductor pillars 1420. In some implementations, a lithography process is performed to pattern the plurality of first trenches using an etch mask (e.g., a photoresist mask and/or a hard mask), and one or more dry etching and/or wet etching processes, such as RIE, are performed to etch the plurality of third trenches in the upper portion of the semiconductor layer 1310.

Figure 15A:
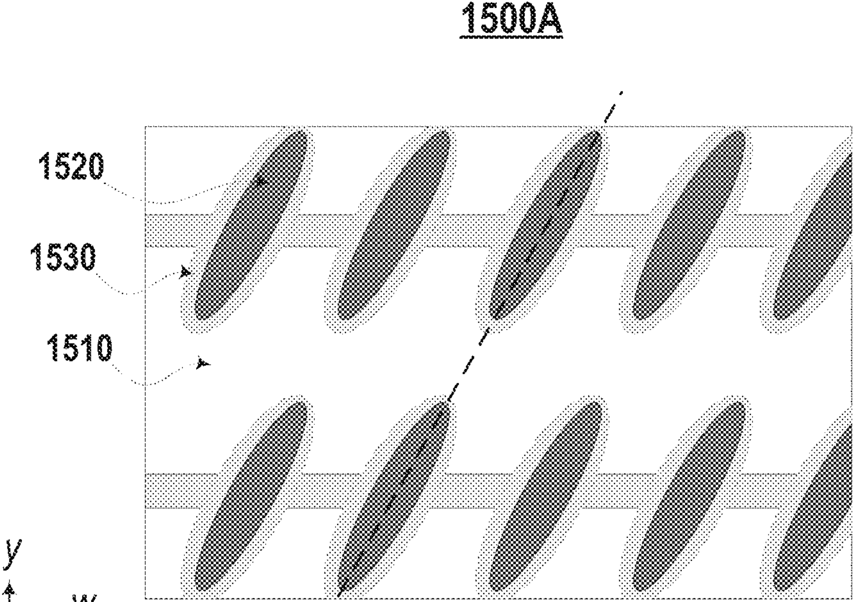
FIG. 15A illustrates a schematic plan view of an exemplary 3D memory device at a certain fabricating stage of the method shown in FIG. 12, according to various implementations of the present disclosure.
Figure 15B:
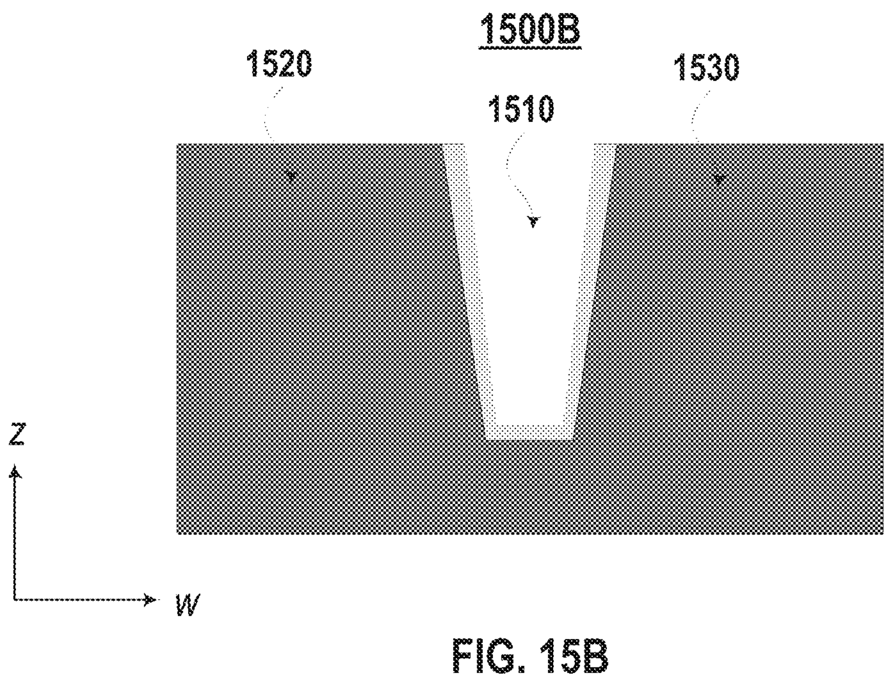
FIG. 15B illustrates a schematic side cross-sectional view of an exemplary 3D memory device at a certain fabricating stage of the method shown in FIG. 12, according to various implementations of the present disclosure.

In some implementations as shown in FIGS. 15A and 15B, portions of the third spacers 1330 exposed by the first trenches 1410 can be removed to form the enlarged first trenches 1510. Portions of each of the array of semiconductor pillars 1420 exposed can be removed by one or more etching processes, such as wet etching, such that the lateral corners of each semiconductor pillar 1420 exposed by the first trenches 1410 are rounded. As such, each of the array of rounded semiconductor pillars 1520 has an oval-like shape having two curved sidewalls exposed by adjacent two enlarged first trenches 1510.

Referring back to FIG. 12, method 1200 can proceed to operation 1203, in which two conductive structures can be formed in each enlarged first trench. In some implementations, each conductive structure can be isolated from an adjacent row of semiconductor pillars by a gate dielectric layer. In some implementations, the conductive structure can at least partially surround the semiconductor pillar. For example, the conductive structure can surround a curved sidewall of the semiconductor pillar from three lateral directions.

In some implementations, a gate dielectric layer 1530 can be formed to cover the exposed sidewalls of the rounded semiconductor pillars 1520. As illustrated in FIGS. 15A and 15B, the gate dielectric layer 1530 can cover the curved sidewalls of each rounded semiconductor pillars 1520 exposed by the enlarged first trenches 1510. In some implementations, the gate dielectric layer 1530 is formed by depositing a layer of dielectric, such as silicon oxide, over the sidewalls of each rounded semiconductor pillars 1520 using one or more thin film deposition processes including, but not limited to, CVD, PVD, ALD, or any combination thereof. It some other implementations, the gate dielectric layer 1530 is formed by a wet oxidation and/or a dry oxidation process, such as in situ steam generation (ISSG) oxidation, which is performed to form native oxide (e.g., silicon oxide) on exposed sidewalls of the rounded semiconductor pillars 1520 (e.g., single crystalline silicon) as the gate dielectric layer 1530.

Figure 16A:
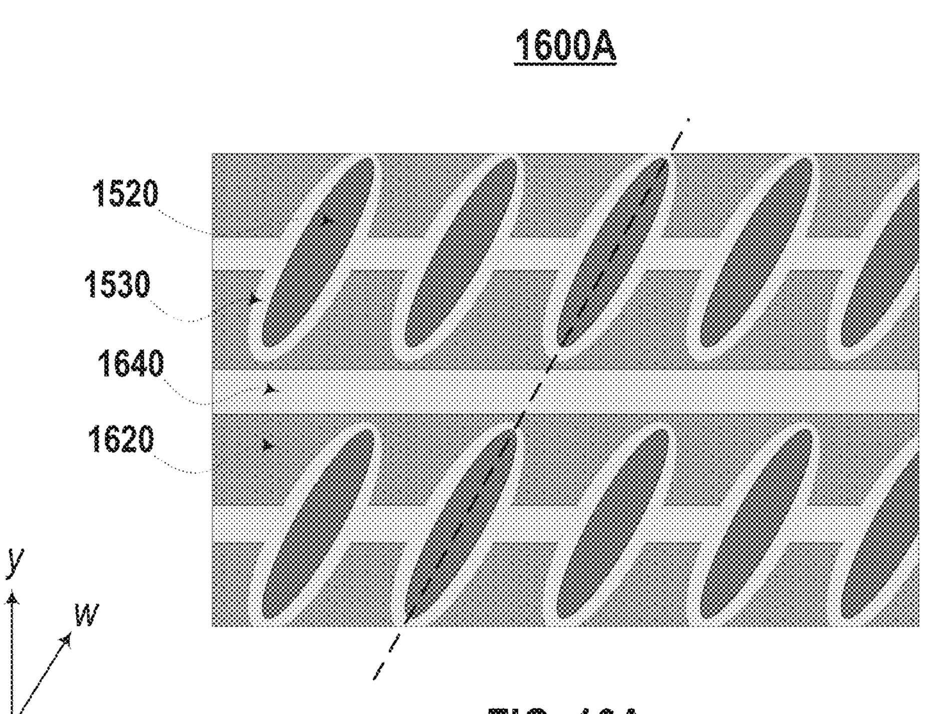
FIG. 16A illustrates a schematic plan view of an exemplary 3D memory device at a certain fabricating stage of the method shown in FIG. 12, according to various implementations of the present disclosure.
Figure 16B:
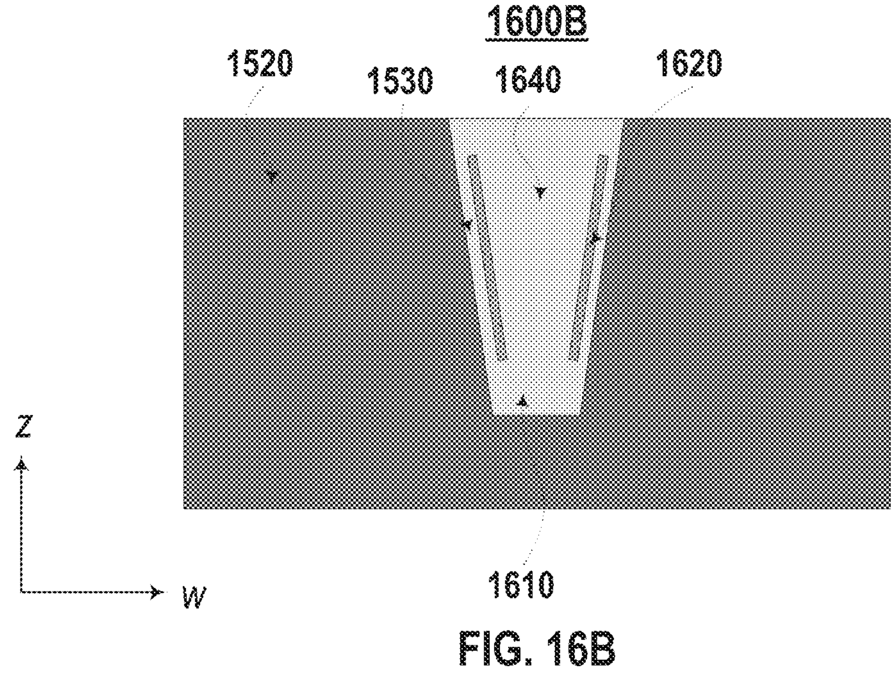
FIG. 16B illustrates a schematic side cross-sectional view of an exemplary 3D memory device at a certain fabricating stage of the method shown in FIG. 12, according to various implementations of the present disclosure.

In some implementations, a lower trench isolation structure can be formed in the bottom of the enlarged first trenches 1510. As shown in FIG. 16B, a lower trench isolation structure 1610 is formed at a bottom of each enlarged first trench 1510. In some implementations, a dielectric, such as silicon oxide, is deposited to fully fill the enlarged first trenches 1510 using one or more thin film deposition processes including, but not limited to, CVD, PVD, ALD, a spin coating process, or any combination thereof. In some implementations, an etch-back process, is performed to remove upper portions of the dielectric, such that the remaining portion of the dielectric form the lower trench isolation structure 1610 located at a bottom portion of the enlarged first trenches 1510.

After forming the lower trench isolation structure 1610, a conductive layer can be formed in each enlarged first trench 1510. In some implementations, to form the conductive layer, one or more conductive layers are deposited in the enlarged first trenches 1510 and over the gate dielectric layer 1530 and the lower trench isolation structure 1610. In some implementations, the conductive layer can be formed by depositing one or more conductive materials, such as metal and/or metal compounds (e.g., W and TiN), over the gate dielectric layer 1530 and the lower trench isolation structure 1610 using one or more thin film deposition processes including, but not limited to, CVD, PVD, ALD, or any combination thereof, to partially fill the enlarged first trenches 1510. For example, layers of TiN and W may be sequentially deposited to form the conductive layer. A planarization process, e.g., CMP, can be performed to remove the excess conductive materials over the top surface of semiconductor layer 1310.

After forming the conductive layer, a plurality of first spacers 1640 each extending along the first lateral direction (x-direction) can be formed to separate the conductor layer into two conductive structures 1620. In some implementations, to form the plurality of first spacers 1640, the conductive layer is patterned and etched to form a plurality of second trenches (not shown) each vertically extending between adjacent sidewalls of the conductive layer on the sidewalls of each enlarged first trench 1510, and laterally extending parallel along the first lateral direction (x-direction). As such, the conductive layer in each enlarged first trench 1510 is separated into two conductive structures 1620. Each conductive structure 1620 can surround the curved sidewall of each rounded semiconductor pillar 1520 from three lateral directions. In some implementations, the conductive structures 1620 are etched back, for example, using dry etch and/or wet etch (e.g., RIE), to form dents, such that the upper end of the conductive structure 1620 is below the top surface of rounded semiconductor pillars 1520. In some implementations, as the gate dielectric layer 1530 is not etched back, the upper end of the conductive structure 1620 is below the upper end of the gate dielectric layer 1530 as well, which is flush with the top surface of rounded semiconductor pillars 1520.

In some implementations, as shown in FIGS. 15A and 15B, a dielectric material, such as silicon oxide, is deposited in the remaining space of second trenches as well as the dents (not shown) to form the plurality of first spacers 1640, using one or more thin film deposition processes including, but not limited to, CVD, PVD, ALD, or any combination thereof. In some implementations, forming the plurality of first spacers 1640 can include forming one or more air gaps (not shown) embedded in the dielectric material. The one or more air gaps can be formed due to the relatively small pitches of the third spacers in the second lateral direction. The relatively large dielectric constant of air in air gaps (e.g., about 4 times the dielectric constant of silicon oxide) can improve the insulation effect between separated conductive material(s) and semiconductive material(s) compared with some dielectrics (e.g., silicon oxide).

Referring back to FIG. 12, method 1200 can then proceed to operation 1205, in which a plurality of second spacers each extending along a first lateral direction can be formed to separate each row of the rounded semiconductor pillars into two rows of semiconductor bodies.

Figure 17A:
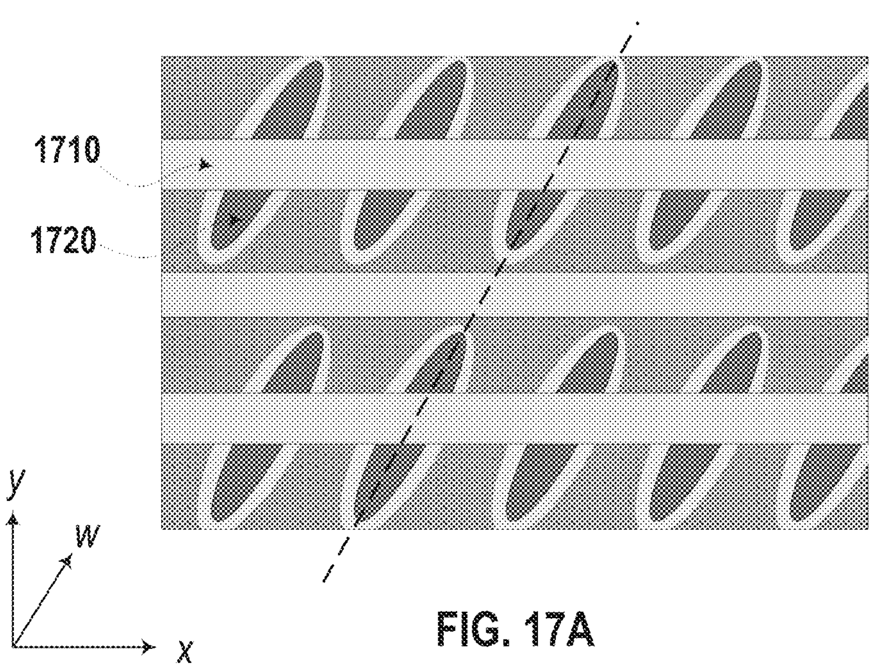
FIG. 17A illustrates a schematic plan view of an exemplary 3D memory device at a certain fabricating stage of the method shown in FIG. 12, according to various implementations of the present disclosure.
Figure 17B:
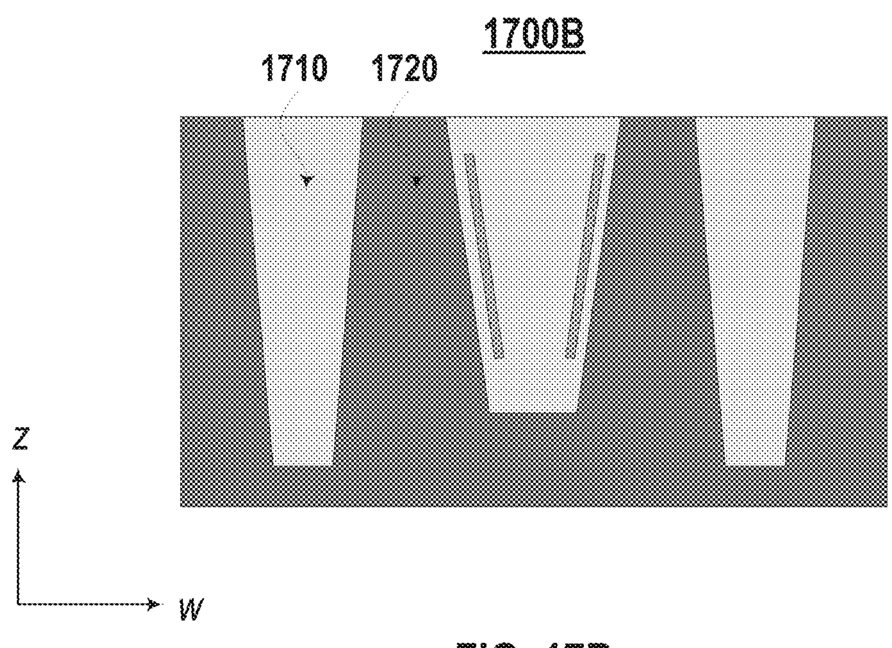
FIG. 17B illustrates a schematic side cross-sectional view of an exemplary 3D memory device at a certain fabricating stage of the method shown in FIG. 12, according to various implementations of the present disclosure.

In some implementations as shown in FIGS. 17A and 17B, forming the plurality of second spacers comprises forming a plurality of fourth trenches (not shown) each extending along the first lateral direction (x-direction) to separate each row of the array of rounded semiconductor pillars 1520 into two rows of semiconductor bodies 1720. In some implementations, a lithography process can be applied to pattern the fourth trenches on the array of rounded semiconductor pillars 1520 using an etch mask (e.g., a photoresist mask and/or a hard mask), and one or more dry etching and/or wet etching processes, such as RIE, are performed on the array rounded of semiconductor pillars 1520 to etch the fourth trenches. The etching can be controlled such that a depth of the fourth trenches can be greater than the depth of the first trenches 1510. A plurality of second spacers 1710 can be formed to fill the plurality of fourth trenches, for example, by depositing a dielectric material, such as silicon oxide, to fill the third and fourth trenches, using one or more thin film deposition processes including, but not limited to, CVD, PVD, ALD, or any combination thereof.

In some implementations, forming the plurality of second spacers 1710 can include forming one or more air gaps (not shown) embedded in the dielectric material. The one or more air gaps can be formed due to the relatively small pitches of the second spacers 1710 in the second lateral direction. The relatively large dielectric constant of air in air gaps (e.g., about 4 times the dielectric constant of silicon oxide) can improve the insulation effect between separated conductive material(s) and semiconductive material(s) compared with some dielectrics (e.g., silicon oxide).

It is noted that, any suitable operations can be performed about operation 1205 to further fabricate the memory device. For example, both ends of the semiconductor body 1720 can be doped to form the source and drain. As another example, a plurality of storage units, such as a plurality of capacitors can be formed to electrically coupled with one of source/drain of each semiconductor body 1720. As yet another example, a plurality of bit lines can be formed to electrically coupled with the other one of source/drain of each semiconductor body 1720.

Figure 18:
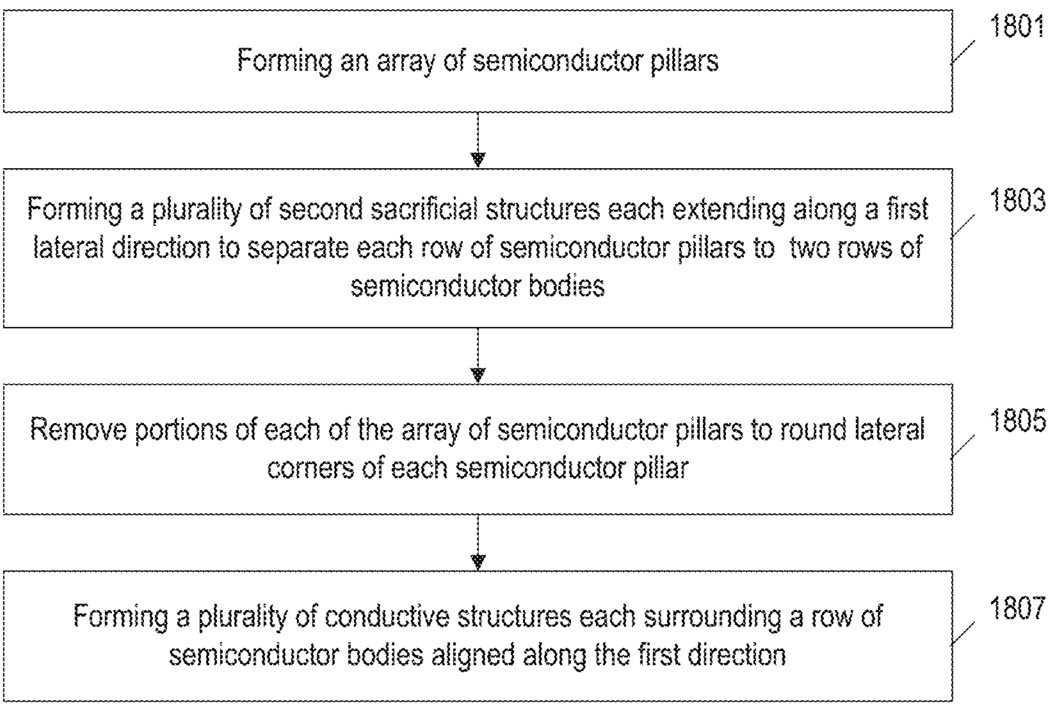
FIG. 18 illustrates a flowchart of an exemplary fabricating method for forming a 3D memory device including vertical transistors, according to some implementations of the present disclosure.

FIG. 18 illustrates a flowchart of an exemplary fabricating method 1800 for forming a 3D memory device including vertical transistors, such as 3D memory device 400A described above in connection with FIGS. 4A and 4B, according to some implementations of the present disclosure. FIGS. 19A-19B, 20A-20B, 21A-21B, 22A-22B, 23A-23B and 24A-24B illustrate schematic plan views and schematic side cross-sectional views of an exemplary 3D memory device at certain fabricating stages of the method 1800 shown in FIG. 18, according to various implementations of the present disclosure. It is understood that the operations shown in method 1800 are not exhaustive and that other operations can be performed as well before, after, or between any of the illustrated operations. Further, some of the operations may be performed simultaneously, or in a different order than shown in FIG. 18.

As shown in FIG. 18, method 1800 can start at operation 1801, in which an array of semiconductor pillars can be formed. In some embodiments, the array of semiconductor pillars can be formed in an upper portion of a semiconductor layer. Each semiconductor pillar can extend vertically (in the z-direction) and have any suitable 3D shape, such as polyhedron shapes or a cylinder shape. That is, the cross-section of each semiconductor pillar in the plan view (e.g., in the x-y plane) can have a square shape, a rectangular shape (or a trapezoidal shape), a circular shape, an oval shape, or any other suitable shapes.

Figure 19A:
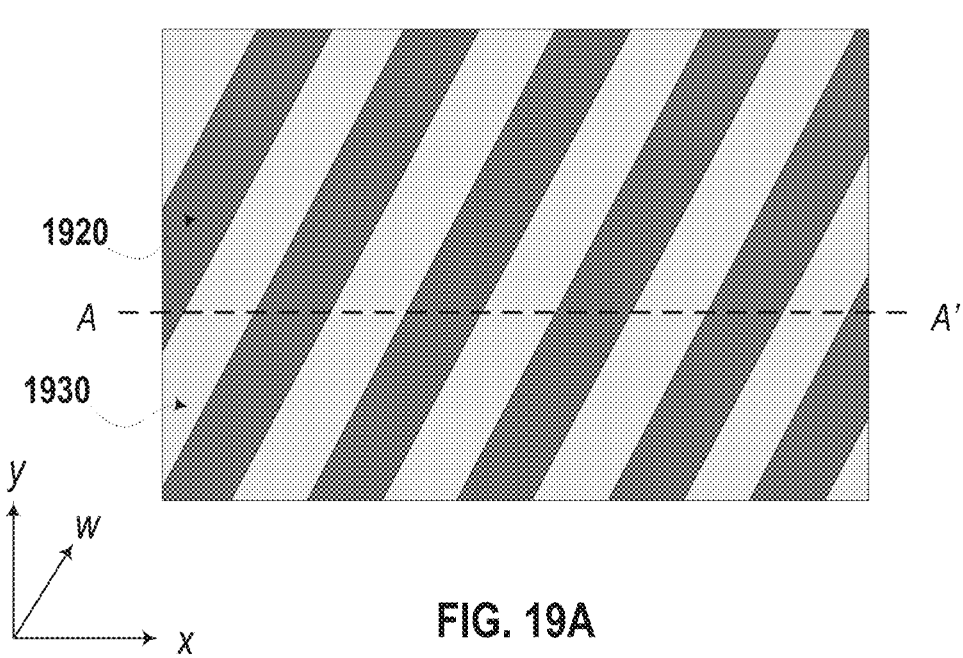
FIG. 19A illustrates a schematic plan view of an exemplary 3D memory device at a certain fabricating stage of the method shown in FIG. 18, according to various implementations of the present disclosure.
Figure 19B:
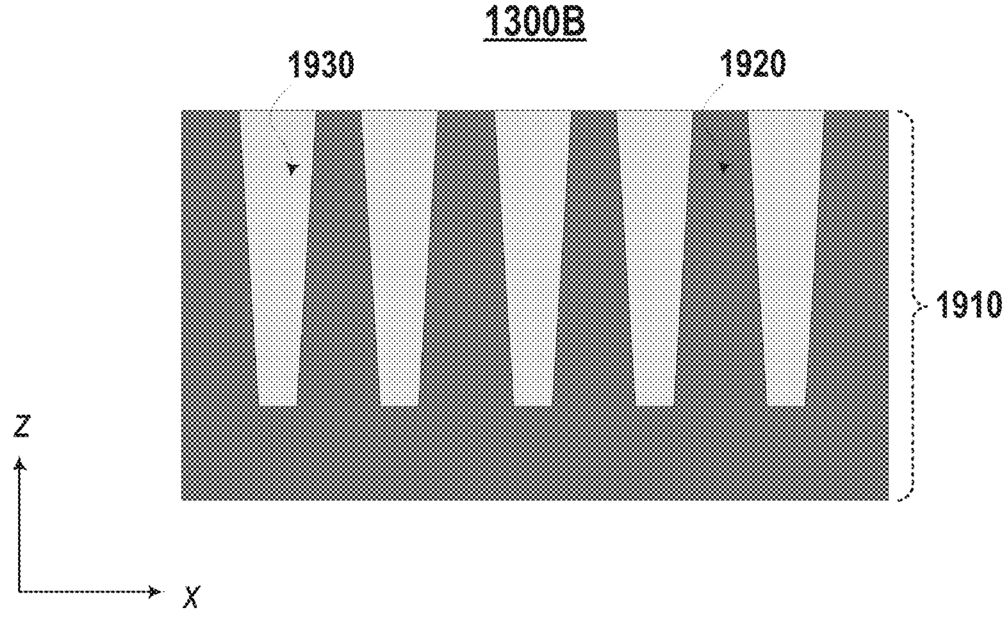
FIG. 19B illustrates a schematic side cross-sectional view of an exemplary 3D memory device at a certain fabricating stage of the method shown in FIG. 18, according to various implementations of the present disclosure.

In some implementations, forming the array of semiconductor pillars can include forming a plurality of semiconductor walls 1920 separated by a plurality of parallel third spacers 1930, as shown in FIGS. 19A and 19B. The plurality of semiconductor walls 1920 and third spacers 1930 each laterally extends along a third lateral direction (w-direction). Forming the plurality of semiconductor walls 1920 and the plurality of parallel third spacers 19730 can include forming a plurality of third trenches vertically extend into an upper portion of a semiconductor layer 710 (e.g., a silicon substrate) as illustrated in a side view of FIG. 19B along AA' line shown in FIG. 19A. The remaining portions of the upper portion of the semiconductor layer 1910 form the plurality of semiconductor walls 1920.

In some implementations, a lithography process is performed to pattern the plurality of third trenches using an etch mask (e.g., a photoresist mask and/or a hard mask), and one or more dry etching and/or wet etching processes, such as RIE, are performed to etch the plurality of third trenches in the upper portion of the semiconductor layer 1910. Since semiconductor walls 1920 are formed by etching semiconductor layer 1910, semiconductor walls 1920 can have the same material as semiconductor layer 1910, such as single crystalline silicon. Then the third spacers 1930 can be formed by depositing a dielectric material, such as silicon oxide, to fill the third trenches, using a thin film deposition process including, but not limited to, CVD, PVD, ALD, or any combination thereof. A planarization process can be performed to remove excess dielectric over the top surface of the semiconductor layer 1910.

Figure 20A:
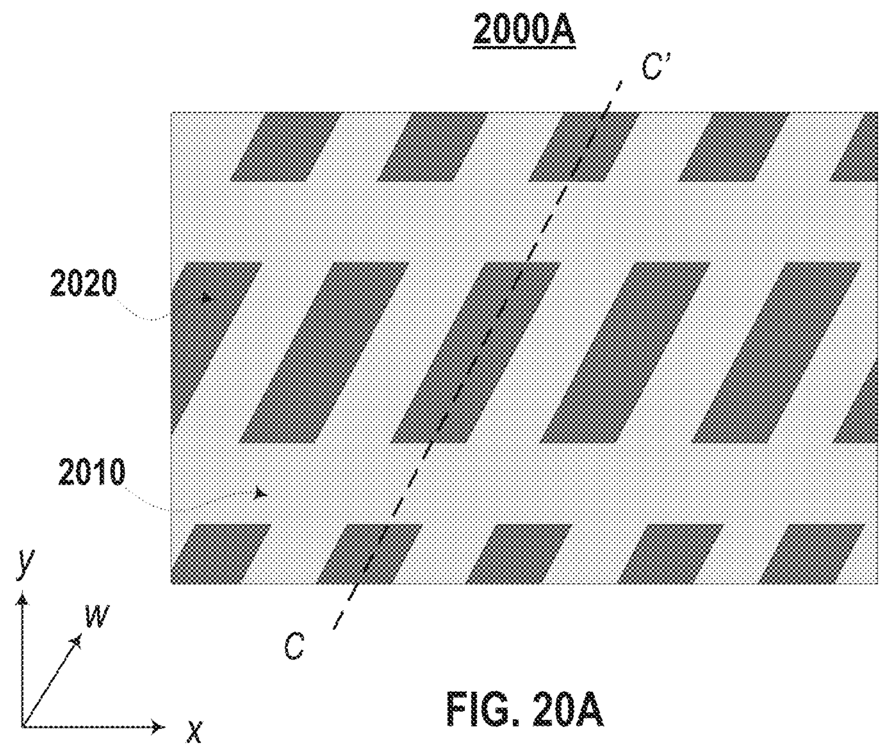
FIG. 20A illustrates a schematic plan view of an exemplary 3D memory device at a certain fabricating stage of the method shown in FIG. 18, according to various implementations of the present disclosure.
Figure 20B:
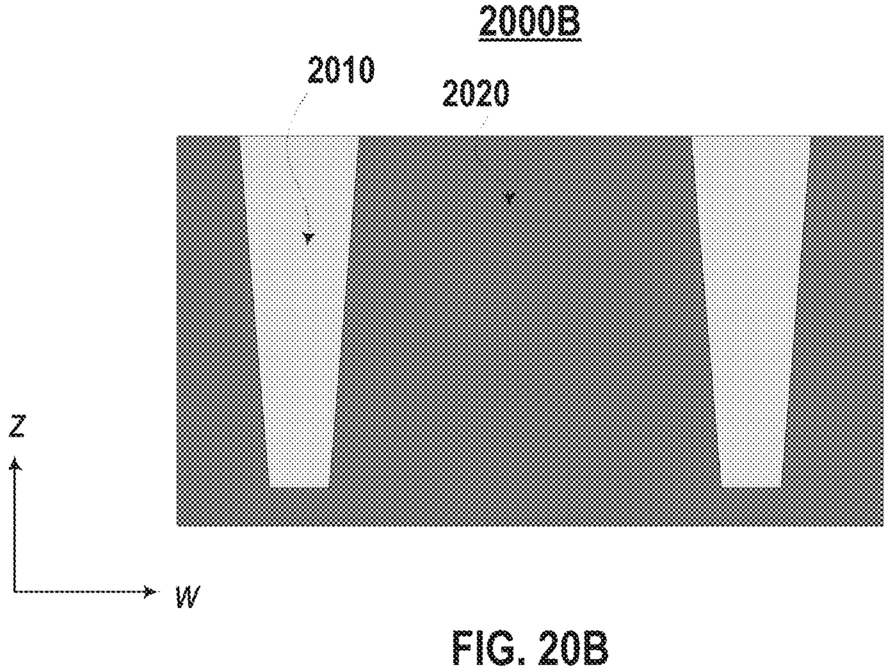
FIG. 20B illustrates a schematic side cross-sectional view of an exemplary 3D memory device at a certain fabricating stage of the method shown in FIG. 18, according to various implementations of the present disclosure.

In some implementations, forming the array of semiconductor pillars can further include forming a plurality of parallel first sacrificial structures 2010 extending along a first lateral direction (x-direction), as shown in FIGS. 20A and 20B. The plurality of parallel first sacrificial structures 2010 can vertically extend into upper portions of the semiconductor layer 1910 as illustrated in a side view of FIG. 20B along CC' line (along the w-direction) shown in FIG. 20A. The plurality of the semiconductor walls 1920 can be separated by the plurality of first sacrificial structures 2010 into an array of semiconductor pillars 2020. In some implementations, a lithography process is performed to pattern the plurality of first trenches using an etch mask (e.g., a photoresist mask and/or a hard mask), and one or more dry etching and/or wet etching processes, such as RIE, are performed to etch the plurality of third trenches in the upper portion of the semiconductor layer 1910.

Referring back to FIG. 18, method 1800 can then proceed to operation 1803, in which a plurality of second sacrificial structures each extending along the first lateral direction can be formed to separate each row of the array of semiconductor pillars into two rows of semiconductor bodies.

Figure 21A:
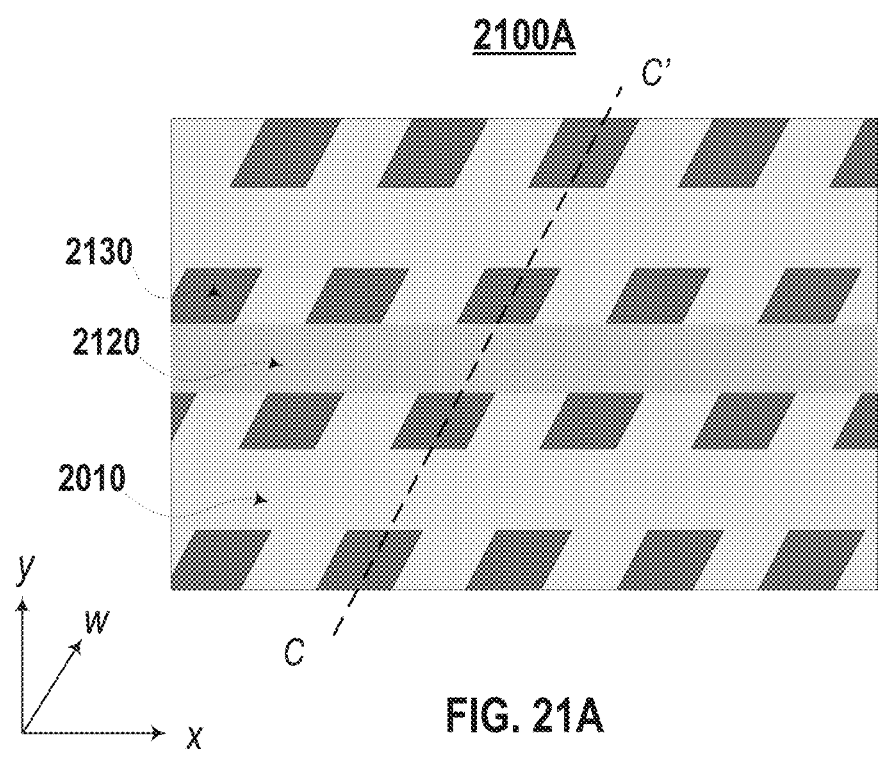
FIG. 21A illustrates a schematic plan view of an exemplary 3D memory device at a certain fabricating stage of the method shown in FIG. 18, according to various implementations of the present disclosure.
Figure 21B:
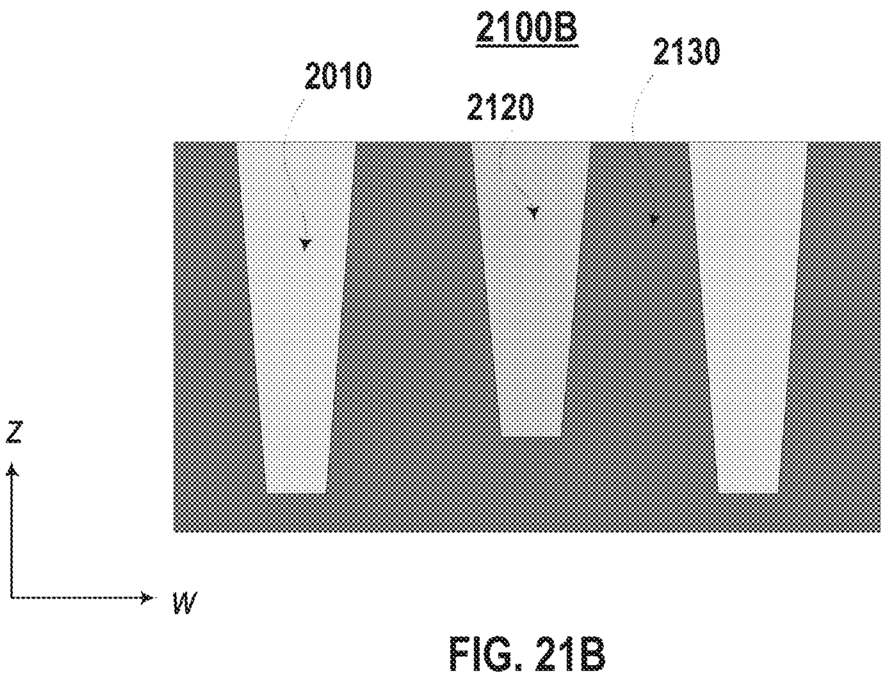
FIG. 21B illustrates a schematic side cross-sectional view of an exemplary 3D memory device at a certain fabricating stage of the method shown in FIG. 18, according to various implementations of the present disclosure.

In some implementations as shown in FIGS. 21A and 21B, forming the plurality of second sacrificial structures 2120 comprises forming a plurality of second trenches each extending along the first lateral direction (x-direction) to separate each row of the array of semiconductor pillars 2020 into two rows of semiconductor bodies 2130. In some implementations, a lithography process can be applied to pattern the second trenches on the array of semiconductor pillars 2020 using an etch mask (e.g., a photoresist mask and/or a hard mask), and one or more dry etching and/or wet etching processes, such as RIE, are performed on the array of semiconductor pillars 820 to etch the second trenches. The etching can be controlled such that a depth of the second trenches can be less than the depth of the first trenches. After forming the second trenches, a plurality of second sacrificial structures 2120 can be formed to fill the plurality of second trenches by depositing a sacrificial material. As shown in FIG. 21B, a depth of second sacrificial structures 2120 is less than a depth of first sacrificial structures 2010.

Referring back to FIG. 18, method 1800 can then proceed to operation 1805, in which the plurality of first and second sacrificial structures, and the third spacers, can be removed to form a plurality of first, second, and third trenches. Portions of each of the array of semiconductor pillars can be removed to round the lateral corners of each semiconductor pillar.

Figure 22A:
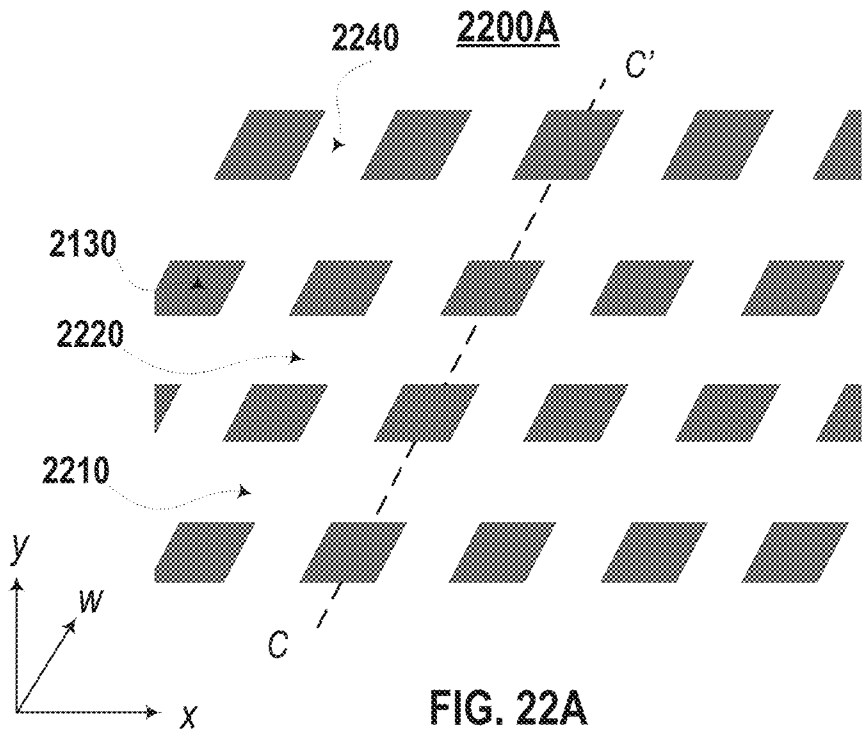
FIG. 22A illustrates a schematic plan view of an exemplary 3D memory device at a certain fabricating stage of the method shown in FIG. 18, according to various implementations of the present disclosure.
Figure 22B:
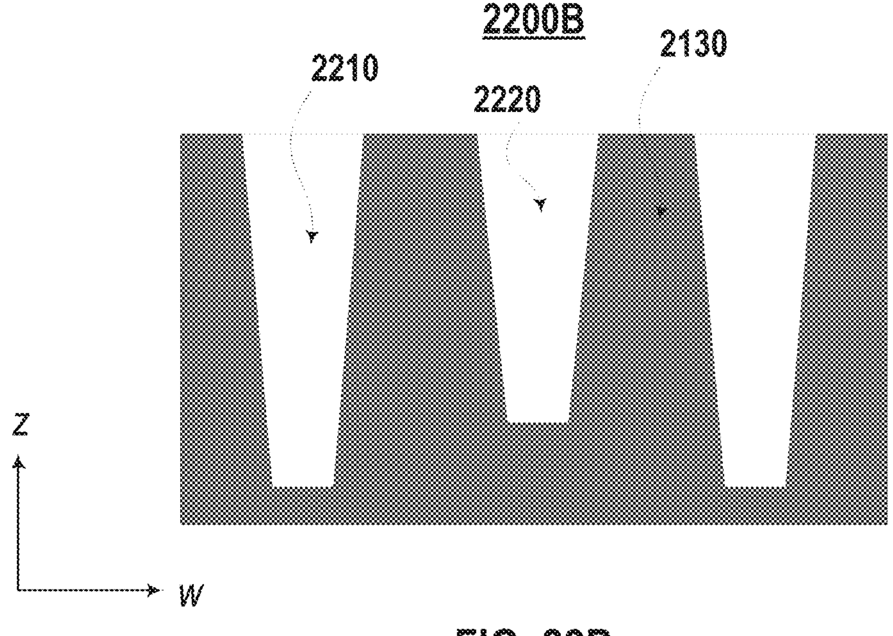
FIG. 22B illustrates a schematic side cross-sectional view of an exemplary 3D memory device at a certain fabricating stage of the method shown in FIG. 18, according to various implementations of the present disclosure.

As shown in FIGS. 22A and 22B, the plurality of first sacrificial structures 2010, second sacrificial structures 2120, and the third spacers 1930 can be removed by any suitable process, such as one or more selective etching processes. As such, the plurality of first trenches 2210, second trenches 2220, and third trenches 2240 can be formed. The plurality of first trenches 2210 and second trenches 2220 can be alternatively arranged in the second lateral direction (y-direction), and each extends along the first lateral direction (x-direction). A depth of the second trenches 2220 can be less than the depth of the first trenches 2210. The plurality of third trenches 2240 can each extend along the third lateral direction (w-direction).

Figure 23A:
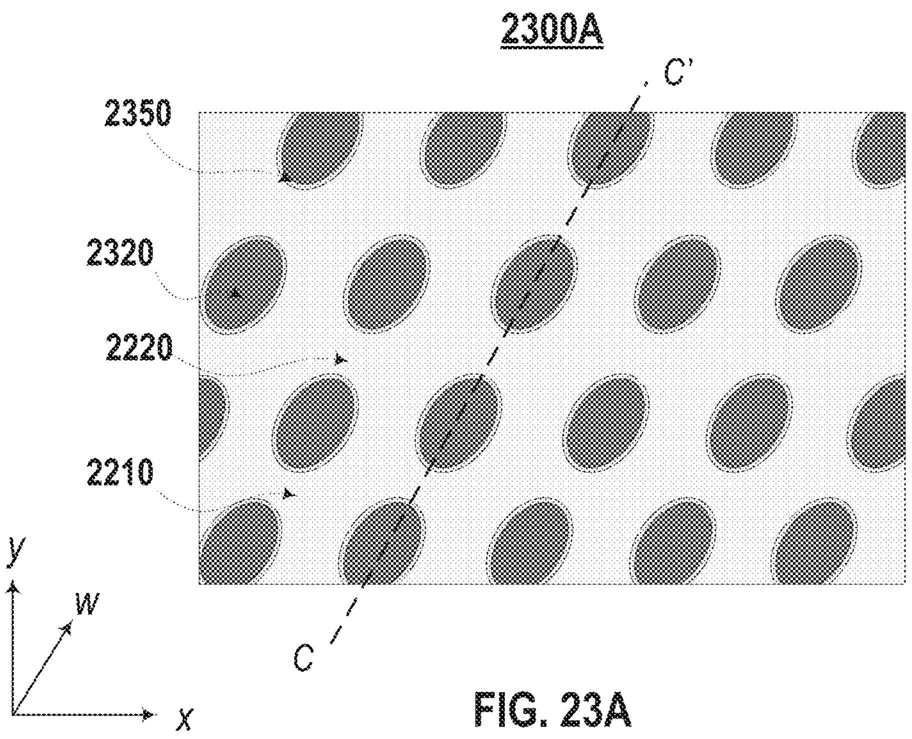
FIG. 23A illustrates a schematic plan view of an exemplary 3D memory device at a certain fabricating stage of the method shown in FIG. 18, according to various implementations of the present disclosure.
Figure 23B:
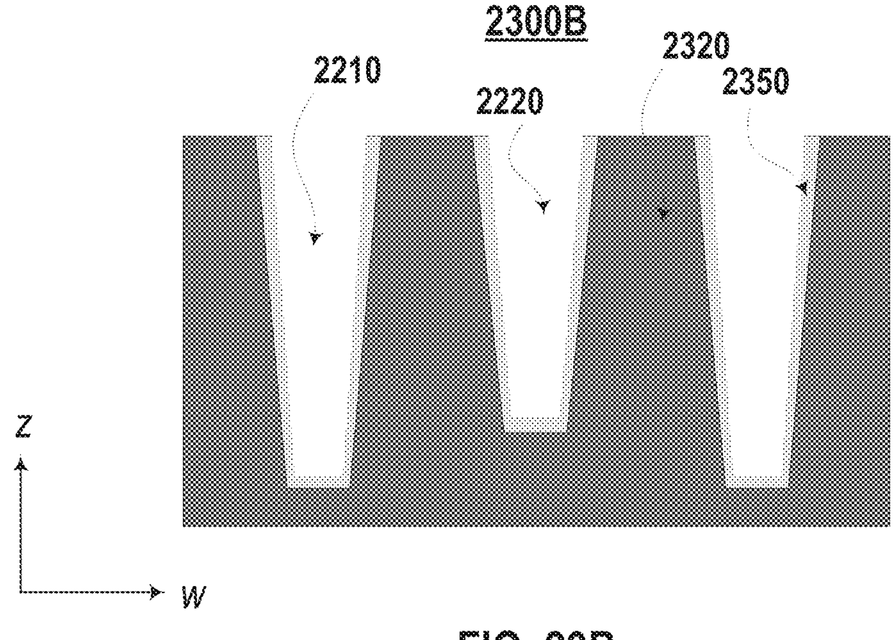
FIG. 23B illustrates a schematic side cross-sectional view of an exemplary 3D memory device at a certain fabricating stage of the method shown in FIG. 18, according to various implementations of the present disclosure.

In some implementations as shown in FIGS. 23A and 23B, portions of each of the array of semiconductor bodies 2130 can be removed by one or more etching processes, such as wet etching, such that the lateral corners of each semiconductor body 2130 exposed by the first, second, and third trenches 2210, 2220, 2240 are rounded. As such, a cross-section of each semiconductor body 2130 in the lateral plane can have an oval-like shape with a longitudinal axis along the third lateral direction (w-direction). Each of the array of semiconductor bodies 2130 has a curved sidewall exposed by the first, second, and third trenches 2210, 2220, 2240.

Referring back to FIG. 18, method 1800 can proceed to operation 1807, in which a plurality of conductive structures can be formed. Each conductive structure can surround each of a row of semiconductor bodies aligned along the first direction. In some implementations, each conductive structure can be isolated from an adjacent row of semiconductor pillars by a gate dielectric layer.

Figure 24A:
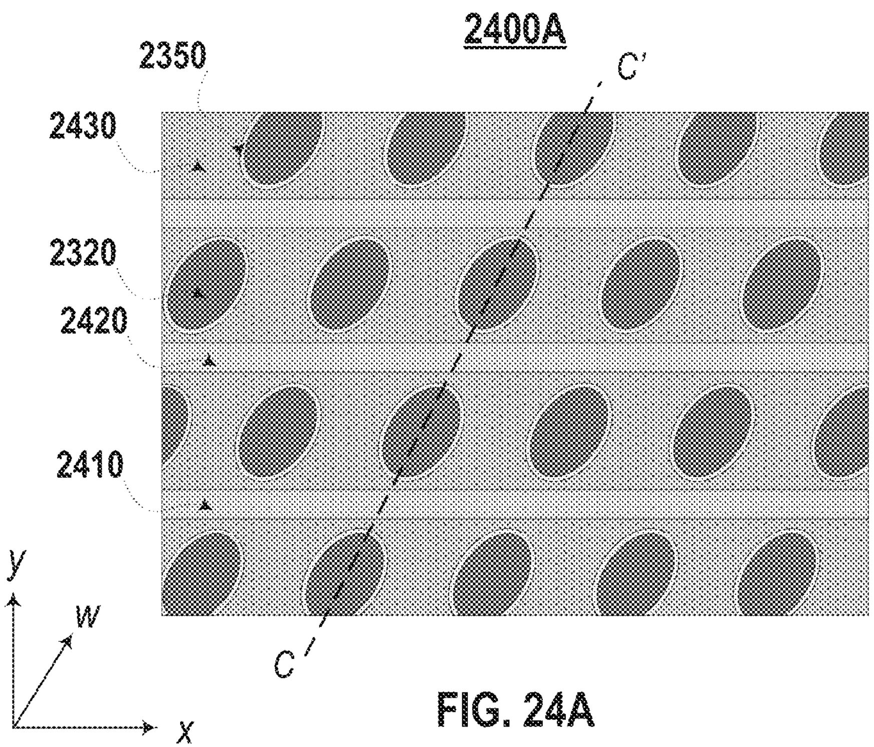
FIG. 24A illustrates a schematic plan view of an exemplary 3D memory device at a certain fabricating stage of the method shown in FIG. 18, according to various implementations of the present disclosure.
Figure 24B:
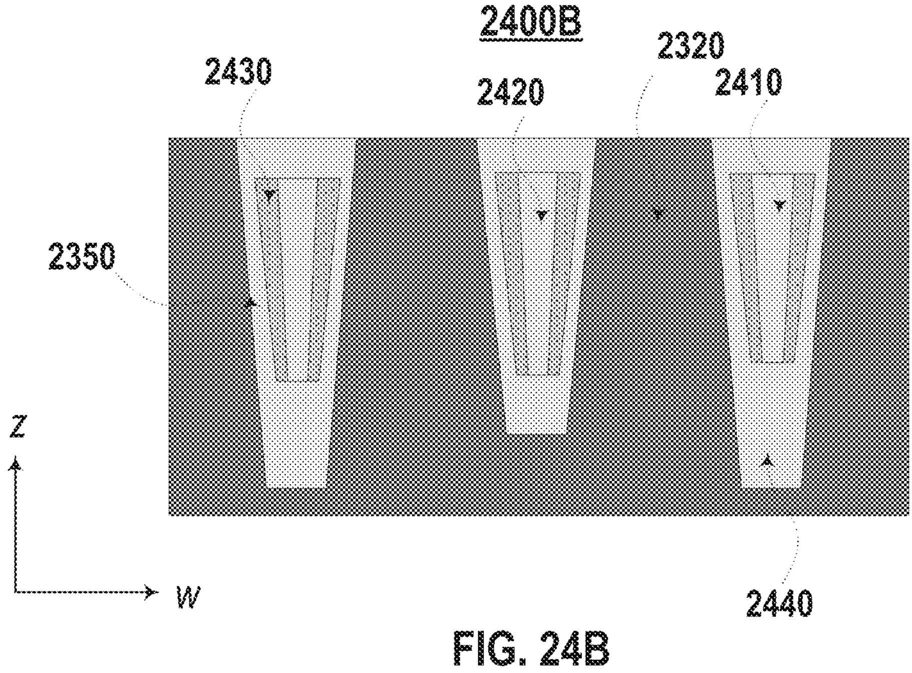
FIG. 24B illustrates a schematic side cross-sectional view of an exemplary 3D memory device at a certain fabricating stage of the method shown in FIG. 18, according to various implementations of the present disclosure.

In some implementations, before forming the conductive structure, a lower trench isolation structure 2440 can be formed at the bottom of the first, second, and third trenches 2210, 2220, 2240. As shown in FIG. 24B, a lower trench isolation structure 2440 is formed at a bottom of the first, second, and third trenches 2210, 2220, 2240. In some implementations, a dielectric, such as silicon oxide, is deposited to fully fill the first, second, and third trenches 2210, 2220, 2240 using one or more thin film deposition processes including, but not limited to, CVD, PVD, ALD, a spin coating process, or any combination thereof. In some implementations, an etch-back process, is performed to remove upper portions of the dielectric, such that the remaining portion of the dielectric form the lower trench isolation structure 2440 located at a bottom portion of the first, second, and third trenches 2210, 2220, 2240.

A conductive layer is formed in the first, second, and third trenches 2210, 2220, 2240. In some implementations, to form the conductive layer, one or more conductive films are deposited in the first, second, and third trenches 2210, 2220, 2240, and over the gate dielectric layer 2350 and the lower trench isolation structure 2440. In some implementations, the conductive layer can be formed by depositing one or more conductive materials, such as metal and/or metal compounds (e.g., W and TiN), over the gate dielectric layer 2350 and the lower trench isolation structure 2440 using one or more thin film deposition processes including, but not limited to, CVD, PVD, ALD, or any combination thereof, to partially fill the first, second, and third trenches 2210, 2220, 2240. For example, layers of TiN and W may be sequentially deposited to form the conductive structure. A planarization process, e.g., CMP, can be performed to remove the excess conductive materials over the top surface of semiconductor layer 1910.

After forming the conductive layer, a plurality of first spacers 2410 and second spacers 2420 each extending along the first lateral direction (x-direction) can be formed to separate the conductor layer into a plurality of conductive structures 2430 each extending along the first lateral direction. In some implementations, to form the plurality of first spacers 2410 and second spacers 2420, the conductive layer is patterned and etched to form a plurality of fourth trenches (not shown) each vertically extending between adjacent sidewalls of the conductive layer on the sidewalls of each first trench 2210, and to form a plurality of fifth trenches (not shown) each vertically extending between adjacent sidewalls of the conductive layer on the sidewalls of each second trench 2220.

The formed plurality of conductive structures 2430 can be laterally separated from each other in the second lateral direction (y-direction) by the fourth and fifth trenches. Each conductive structure 2430 can extend along the first lateral direction (x-direction) and laterally surround each of a corresponding row of semiconductor bodies 2320. The conductive structure 2430 is separated from the semiconductor bodies 2320 by the gate dielectric layer 2350. In some implementations, the conductive structures 2430 are etched back, for example, using dry etch and/or wet etch (e.g., RIE), to form dents, such that the upper end of the conductive structure 2430 is below the top surface of semiconductor body 2320. In some implementations, as the gate dielectric layer 2350 is not etched back, the upper end of the conductive structure 2430 is below the upper end of the gate dielectric layer 2350 as well, which is flush with the top surface of semiconductor body 2320.

A dielectric material, such as silicon oxide, is deposited in the remaining space of fourth and fifth trenches as well as the dents (not shown) to form the plurality of first spacers 2410 and second spacers 2420, using one or more thin film deposition processes including, but not limited to, CVD, PVD, ALD, or any combination thereof. In some implementations, forming the plurality of first spacers 2410 and second spacers 2420 can include forming one or more air gaps (not shown) embedded in the dielectric material. The one or more air gaps can be formed due to the relatively small pitches of the third spacers in the second lateral direction. The relatively large dielectric constant of air in air gaps (e.g., about 4 times the dielectric constant of silicon oxide) can improve the insulation effect between separated conductive material(s) and semiconductive material(s) compared with some dielectrics (e.g., silicon oxide).

It is noted that, any suitable operations can be performed about operation 1807 to further fabricate the memory device. For example, both ends of semiconductor body 2320 can be doped to form the source and drain. As another example, a plurality of storage units, such as a plurality of capacitors can be formed to electrically coupled with one of source/drain of each semiconductor body 2320. As yet another example, a plurality of bit lines can be formed to electrically coupled with the other one of source/drain of each semiconductor body 2320. Specifically, in some implementations not shown in the figures, since the depth of the first spacers 2410 is greater than the depth of the second spacers of 2420, after the semiconductor layer 1910 is thinned from the backside, the adjacent two semiconductor bodies 2320 next to the first spacer 2410 can be separated while the adjacent two semiconductor bodies 2320 next to the second spacer 2420 can connected on the lower ends. After doping the connected lower ends of the semiconductor bodies 2320, pairs of vertical transistors sharing a common source/drain can be formed, and each bit line can be coupled with the common sources/drains of a column of pairs of vertical transistors.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:

an array of vertical transistors each comprising:

a semiconductor body extending in a vertical direction, and a gate structure laterally covering a curved sidewall of the semiconductor body without covering a flat sidewall of the semiconductor body;

wherein each row of the vertical transistors in a first lateral direction share a common word line extending in the first lateral direction and comprising the gate structures of the row of the vertical transistors, and adjacent rows of the vertical transistors are misaligned along a second lateral direction perpendicular with the first lateral direction.

2. The semiconductor device of claim 1, wherein:

the array of vertical transistors are aligned along a third lateral direction different from the first lateral direction and the second lateral direction.

3. The semiconductor device of claim 2, wherein:

a lateral cross section of the semiconductor body is a portion of an oval-like shape.

4. The semiconductor device of claim 3, wherein:

the oval-like shape has a longitudinal axis along the third lateral direction.

5. The semiconductor device of claim 3, wherein:

the flat sidewall of the semiconductor body is along the first lateral direction.

6. The semiconductor device of claim 2, further comprising:

a plurality of spacers each extending along the first lateral direction between rows of the vertical transistors to separate adjacent word lines.

7. The semiconductor device of claim 6, wherein the plurality of spacers comprise:

a plurality of first spacers and second spacers alternatively arranged along the second lateral direction, a first depth of the first spacers is greater than a second depth of the second spacers.

8. The semiconductor device of claim 7, wherein:

two adjacent vertical transistors along the third lateral direction and separated by one second spacer share a common source/drain at a joint first end of the semiconductor bodies of the two adjacent vertical transistors and connected to a bit line extending along the second lateral direction; and two adjacent vertical transistors along the third lateral direction and separated by one first spacer are connected to adjacent two bit lines, respectively.

9. The semiconductor device of claim 1, wherein each vertical transistor further comprises:

a curved gate dielectric layer between the gate structure and the semiconductor body.

10. The semiconductor device of claim 8, further comprising:

an array of memory cells, each memory cell comprising:

one of the array of vertical transistors; and a capacitor in electrical connection with a separated source/drain at a second end of the one of the array of vertical transistors, wherein the second end is opposite to the joint first end.

11. A memory system, comprising:

a memory device comprising an array of memory cells, each memory cell comprising:

a capacitor, and a vertical transistor comprising:

a semiconductor body extending in a vertical direction, and a gate structure laterally covering a curved sidewall of the semiconductor body without covering a flat sidewall the semiconductor body;

wherein each row of the vertical transistors in a first lateral direction share a common word line extending in the first lateral direction and comprising the plurality of gate structures of the row of the vertical transistors, and adjacent rows of vertical transistors are misaligned along a second lateral direction perpendicular with the first lateral direction; and a memory controller configured to control the memory device.

12. The memory system of claim 11, wherein:

a lateral cross section of the semiconductor body is a portion of an oval-like shape with a longitudinal axis along a third lateral direction different from the first lateral direction and the second lateral direction; and the array of vertical transistors are aligned along the third lateral direction.

13. The memory system of claim 11, wherein: the flat sidewall of the semiconductor body is along the first lateral direction.

14. The memory system of claim 12, further comprising:

a plurality of spacers each extending along the first lateral direction between rows of the vertical transistors to separate adjacent word lines.

15. The memory system of claim 14, wherein the plurality of spacers comprise:

a plurality of first spacers and second spacers alternatively arranged along the second lateral direction, a first depth of the first spacers is greater than a second depth of the second spacers.

16. The memory system of claim 15, wherein:

two adjacent vertical transistors along the third lateral direction and separated by one second spacer share a common source/drain at a joint first end of the semiconductor bodies of the two adjacent vertical transistors and connected to a bit line extending along the second lateral direction; and two adjacent vertical transistors along the third lateral direction and separated by one first spacer are connected to adjacent two bit lines, respectively.

17. The memory system of claim 11, wherein each vertical transistor further comprises: a curved gate dielectric layer between the gate structure and the semiconductor body.

18. The memory system of claim 16, wherein:

the capacitor is in electrical connection with a separated source/drain at a second end of the one of the array of vertical transistors, wherein the second end is opposite to the joint first end.

19. The memory system of claim 16, wherein the lateral cross section of the semiconductor bodies of the two adjacent vertical transistors are portions of a same oval-like shape.

20. The semiconductor device of claim 8, wherein the lateral cross section of the semiconductor bodies of the two adjacent vertical transistors are portions of a same oval-like shape.

* * * * *